US008137465B1

(12) United States Patent
Shrinivasan et al.

(10) Patent No.: US 8,137,465 B1
(45) Date of Patent: Mar. 20, 2012

(54) SINGLE-CHAMBER SEQUENTIAL CURING OF SEMICONDUCTOR WAFERS

(75) Inventors: Krishna Shrinivasan, San Jose, CA (US); Feng Wang, Fremont, CA (US); George Kamian, Scotts Valley, CA (US); Steve Gentile, Sunnyvale, CA (US); Mark Yam, Monte Sereno, CA (US)

(73) Assignee: Novellus Systems, Inc., San Jose, CA (US)

( * ) Notice: Subject to any disclaimer, the term of this patent is extended or adjusted under 35 U.S.C. 154(b) by 425 days.

(21) Appl. No.: 11/115,576

(22) Filed: Apr. 26, 2005

(51) Int. Cl.
*C23C 16/48* (2006.01)
*C23C 16/458* (2006.01)
*C23F 1/00* (2006.01)
*H01L 21/306* (2006.01)
*C23C 16/06* (2006.01)
*C23C 16/22* (2006.01)

(52) U.S. Cl. ............... 118/719; 156/345.31; 156/345.54
(58) Field of Classification Search ............. 156/345.55, 156/345.31, 345.54; 118/719
See application file for complete search history.

(56) References Cited

U.S. PATENT DOCUMENTS

| 3,504,181 | A |   | 3/1970  | Campbell et al. |
| 3,612,825 | A |   | 10/1971 | Chase et al. |
| 3,983,385 | A |   | 9/1976  | Troue |
| 4,357,451 | A |   | 11/1982 | McDaniel |
| 4,391,663 | A |   | 7/1983  | Hutter, III |
| 4,457,359 | A |   | 7/1984  | Holden |
| 4,535,835 | A |   | 8/1985  | Holden |
| 4,563,589 | A | * | 1/1986  | Scheffer ............ 250/504 R |
| 4,872,947 | A |   | 10/1989 | Wang et al. |
| 4,885,262 | A |   | 12/1989 | Ting et al. |
| 5,113,929 | A |   | 5/1992  | Nakagawa et al. |
| 5,166,101 | A |   | 11/1992 | Lee et al. |
| 5,174,881 | A | * | 12/1992 | Iwasaki et al. ........... 204/298.25 |
| 5,178,682 | A | * | 1/1993  | Tsukamoto et al. ......... 118/722 |
| 5,228,208 | A |   | 7/1993  | White et al. |
| 5,268,320 | A |   | 12/1993 | Holler et al. |
| 5,282,121 | A | * | 1/1994  | Bornhorst et al. ............ 362/294 |
| 5,288,684 | A | * | 2/1994  | Yamazaki et al. ............ 118/722 |
| 5,298,939 | A | * | 3/1994  | Swanson et al. ................ 355/53 |

(Continued)

FOREIGN PATENT DOCUMENTS

JP           62229833 A    * 10/1987

(Continued)

OTHER PUBLICATIONS

Bandyopadhyay et al., "Method to Improve Mechanical Strength of Low-K Dielectric Film Using Modulated UV Exposure", U.S. Appl. No. 10/825,888, filed Apr. 16, 2004.

(Continued)

*Primary Examiner* — Rudy Zervigon
(74) *Attorney, Agent, or Firm* — Weaver Austin Villeneuve & Sampson LLP

(57) ABSTRACT

The present invention relates to curing of semiconductor wafers. More particularly, the invention relates to cure chambers containing multiple cure stations, each featuring one or more UV light sources. The wafers are cured by sequential exposure to the light sources in each station. In some embodiments, the wafers remain stationary with respect to the light source during exposure. In other embodiments, there is relative movement between the light source and the wafer during exposure. The invention also provides chambers that may be used to independently modulate the cross-linking, density and increase in stress of a cured material by providing independent control of the wafer temperature and UV intensity.

32 Claims, 5 Drawing Sheets

U.S. PATENT DOCUMENTS

| | | | |
|---|---|---|---|
| 5,354,715 A | 10/1994 | Wang et al. | |
| 5,413,664 A * | 5/1995 | Yagi et al. | 156/345.32 |
| 5,426,076 A | 6/1995 | Moghadam et al. | |
| 5,447,431 A | 9/1995 | Muka | |
| 5,504,042 A | 4/1996 | Cho et al. | |
| 5,518,959 A | 5/1996 | Jang et al. | |
| 5,552,927 A * | 9/1996 | Wheatly et al. | 359/359 |
| 5,558,717 A | 9/1996 | Zhao et al. | |
| 5,582,880 A | 12/1996 | Mochizuki et al. | |
| 5,588,827 A | 12/1996 | Muka | |
| 5,674,783 A | 10/1997 | Jang et al. | |
| 5,686,054 A | 11/1997 | Barthel et al. | |
| 5,700,844 A | 12/1997 | Hedrick et al. | |
| 5,789,027 A | 8/1998 | Watkins et al. | |
| 5,811,762 A | 9/1998 | Tseng | |
| 5,840,600 A | 11/1998 | Yamazaki et al. | |
| 5,851,715 A | 12/1998 | Barthel et al. | |
| 5,858,457 A | 1/1999 | Brinker et al. | |
| 5,876,798 A | 3/1999 | Vassiliev | |
| 5,877,095 A | 3/1999 | Tamura et al. | |
| 6,015,503 A * | 1/2000 | Butterbaugh et al. | 216/66 |
| 6,072,163 A | 6/2000 | Armstrong et al. | |
| 6,080,965 A | 6/2000 | Osawa | |
| 6,087,632 A | 7/2000 | Mizosaki et al. | |
| 6,098,637 A | 8/2000 | Parke | |
| 6,132,814 A | 10/2000 | Livesay et al. | |
| 6,136,680 A | 10/2000 | Lai et al. | |
| 6,140,252 A | 10/2000 | Cho et al. | |
| 6,150,272 A | 11/2000 | Liu et al. | |
| 6,200,634 B1 | 3/2001 | Johnsgard et al. | |
| 6,214,184 B1 | 4/2001 | Chien et al. | |
| 6,228,438 B1 | 5/2001 | Schmitt | |
| 6,228,563 B1 | 5/2001 | Starov et al. | |
| 6,232,248 B1 | 5/2001 | Shinriki et al. | |
| 6,254,689 B1 | 7/2001 | Meder | |
| 6,268,288 B1 | 7/2001 | Hautala et al. | |
| 6,270,846 B1 | 8/2001 | Brinker et al. | |
| 6,271,273 B1 | 8/2001 | You et al. | |
| 6,307,184 B1 | 10/2001 | Womack et al. | |
| 6,329,017 B1 | 12/2001 | Liu et al. | |
| 6,340,628 B1 | 1/2002 | Van Cleemput et al. | |
| 6,365,266 B1 | 4/2002 | MacDougall et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,394,797 B1 * | 5/2002 | Sugaya et al. | 432/253 |
| 6,399,212 B1 | 6/2002 | Sakai et al. | |
| 6,413,321 B1 | 7/2002 | Kim et al. | |
| 6,420,441 B1 | 7/2002 | Allen et al. | |
| 6,444,715 B1 | 9/2002 | Mukherjee et al. | |
| 6,467,491 B1 * | 10/2002 | Sugiura et al. | 134/1.3 |
| 6,479,374 B1 | 11/2002 | Ioka et al. | |
| 6,479,409 B2 | 11/2002 | Shioya et al. | |
| 6,485,599 B1 | 11/2002 | Glownia et al. | |
| 6,518,130 B1 | 2/2003 | Ohno | |
| 6,530,380 B1 | 3/2003 | Zhou et al. | |
| 6,531,193 B2 | 3/2003 | Fonash et al. | |
| 6,534,395 B2 | 3/2003 | Werkhoven et al. | |
| 6,548,113 B1 | 4/2003 | Birnbaum et al. | |
| 6,558,755 B2 | 5/2003 | Berry et al. | |
| 6,559,424 B2 | 5/2003 | O'Carroll et al. | |
| 6,563,092 B1 * | 5/2003 | Shrinivasan et al. | 219/502 |
| 6,576,300 B1 | 6/2003 | Berry et al. | |
| 6,596,654 B1 | 7/2003 | Bayman et al. | |
| 6,629,012 B1 | 9/2003 | Riley et al. | |
| 6,635,575 B1 | 10/2003 | Xia et al. | |
| 6,639,189 B2 | 10/2003 | Ramanan et al. | |
| 6,644,786 B1 | 11/2003 | Leben | |
| 6,677,251 B1 | 1/2004 | Lu et al. | |
| 6,740,602 B1 | 5/2004 | Hendriks et al. | |
| 6,740,605 B1 | 5/2004 | Shiraiwa et al. | |
| 6,756,085 B2 | 6/2004 | Waldfried et al. | |
| 6,759,098 B2 | 7/2004 | Han et al. | |
| 6,770,866 B2 | 8/2004 | Retschke et al. | |
| 6,797,643 B2 | 9/2004 | Rocha-Alvarez et al. | |
| 6,805,801 B1 | 10/2004 | Humayun et al. | |
| 6,812,043 B2 | 11/2004 | Bao et al. | |
| 6,821,906 B2 * | 11/2004 | Wada et al. | 438/708 |
| 6,831,284 B2 | 12/2004 | Demos et al. | |
| 6,835,417 B2 | 12/2004 | Saenger et al. | |
| 6,848,458 B1 | 2/2005 | Shrinivasan et al. | |
| 6,856,712 B2 | 2/2005 | Fauver et al. | |
| 6,860,965 B1 | 3/2005 | Stevens | |
| 6,884,738 B2 | 4/2005 | Asai et al. | |
| 6,895,179 B2 | 5/2005 | Kanno | |
| 6,899,765 B2 | 5/2005 | Krivts et al. | |
| 6,921,727 B2 | 7/2005 | Chiang et al. | |
| 6,958,301 B2 | 10/2005 | Kim et al. | |
| 7,005,390 B2 | 2/2006 | Ramachandrarao et al. | |
| 7,018,479 B2 | 3/2006 | Goodwin | |
| 7,018,918 B2 | 3/2006 | Kloster et al. | |
| 7,025,831 B1 * | 4/2006 | Butterbaugh et al. | 118/724 |
| 7,030,041 B2 | 4/2006 | Li et al. | |
| 7,067,819 B2 | 6/2006 | Janik | |
| 7,087,497 B2 | 8/2006 | Yuan et al. | |
| 7,094,713 B1 | 8/2006 | Niu et al. | |
| 7,097,712 B1 * | 8/2006 | Yamazaki et al. | 118/715 |
| 7,105,463 B2 | 9/2006 | Kurita et al. | |
| 7,132,334 B2 | 11/2006 | Lin | |
| 7,138,606 B2 | 11/2006 | Kanno et al. | |
| 7,148,155 B1 | 12/2006 | Tarafdar et al. | |
| 7,166,531 B1 | 1/2007 | van den Hoek et al. | |
| 7,176,144 B1 | 2/2007 | Wang et al. | |
| 7,208,389 B1 | 4/2007 | Tipton et al. | |
| 7,235,459 B2 | 6/2007 | Sandhu | |
| 7,241,704 B1 | 7/2007 | Wu et al. | |
| 7,244,672 B2 | 7/2007 | Nguyen et al. | |
| 7,247,582 B2 | 7/2007 | Stern et al. | |
| 7,253,125 B1 | 8/2007 | Bandyopadhyay et al. | |
| 7,256,111 B2 | 8/2007 | Lopatin et al. | |
| 7,265,061 B1 | 9/2007 | Cho et al. | |
| 7,304,302 B1 | 12/2007 | Nunan et al. | |
| 7,327,948 B1 | 2/2008 | Shrinivasan et al. | |
| 7,332,445 B2 | 2/2008 | Lukas et al. | |
| 7,381,659 B2 | 6/2008 | Nguyen et al. | |
| 7,390,537 B1 | 6/2008 | Wu et al. | |
| 7,394,067 B1 | 7/2008 | Soltz et al. | |
| 7,410,355 B2 | 8/2008 | Granneman et al. | |
| 7,481,882 B2 | 1/2009 | Won et al. | |
| 7,504,663 B2 | 3/2009 | Yamazaki et al. | |
| 7,510,982 B1 | 3/2009 | Draeger et al. | |
| 7,611,757 B1 | 11/2009 | Bandyopadhyay et al. | |
| 7,622,162 B1 | 11/2009 | Schravendijk et al. | |
| 7,638,780 B2 | 12/2009 | Kilburn et al. | |
| 7,642,205 B2 | 1/2010 | Timans | |
| 7,665,951 B2 | 2/2010 | Kurita et al. | |
| 7,704,894 B1 | 4/2010 | Henry et al. | |
| 7,772,527 B2 | 8/2010 | Choi | |
| 7,790,633 B1 | 9/2010 | Tarafdar et al. | |
| 7,845,891 B2 | 12/2010 | Lee et al. | |
| 7,851,232 B2 | 12/2010 | van Schravendijk et al. | |
| 7,906,174 B1 | 3/2011 | Wu et al. | |
| 7,935,940 B1 | 5/2011 | Smargiassi | |
| 2001/0001501 A1 | 5/2001 | Lee et al. | |
| 2001/0014512 A1 | 8/2001 | Lyons et al. | |
| 2001/0018267 A1 | 8/2001 | Shinriki et al. | |
| 2002/0001973 A1 | 1/2002 | Wu et al. | |
| 2002/0016085 A1 | 2/2002 | Huang et al. | |
| 2002/0034626 A1 | 3/2002 | Liu et al. | |
| 2002/0064341 A1 | 5/2002 | Fauver et al. | |
| 2002/0106500 A1 | 8/2002 | Albano et al. | |
| 2002/0117109 A1 * | 8/2002 | Hazelton et al. | 118/620 |
| 2002/0123218 A1 | 9/2002 | Shioya et al. | |
| 2002/0123240 A1 | 9/2002 | Gallagher et al. | |
| 2002/0148563 A1 * | 10/2002 | Carlson et al. | 156/345.31 |
| 2002/0162630 A1 | 11/2002 | Satoh et al. | |
| 2002/0172766 A1 | 11/2002 | Laxman et al. | |
| 2002/0195683 A1 | 12/2002 | Kim et al. | |
| 2003/0013280 A1 * | 1/2003 | Yamanaka | 438/487 |
| 2003/0015764 A1 | 1/2003 | Raaijmakers et al. | |
| 2003/0064604 A1 | 4/2003 | Umeda | |
| 2003/0064607 A1 | 4/2003 | Leu et al. | |
| 2003/0068881 A1 | 4/2003 | Xia et al. | |
| 2003/0113187 A1 | 6/2003 | Lei et al. | |

| | | |
|---|---|---|
| 2003/0134038 A1 | 7/2003 | Paranjpe |
| 2003/0157248 A1 | 8/2003 | Watkins et al. |
| 2003/0157267 A1 | 8/2003 | Waldfried et al. |
| 2003/0194493 A1 | 10/2003 | Chang et al. |
| 2003/0200931 A1 | 10/2003 | Goodwin |
| 2003/0228770 A1 | 12/2003 | Lee et al. |
| 2004/0004247 A1 | 1/2004 | Forbes et al. |
| 2004/0018319 A1 | 1/2004 | Waldfried et al. |
| 2004/0022960 A1 | 2/2004 | Rhee et al. |
| 2004/0023513 A1* | 2/2004 | Aoyama et al. ............... 438/778 |
| 2004/0029391 A1 | 2/2004 | Kirkpatrick et al. |
| 2004/0033662 A1 | 2/2004 | Lee et al. |
| 2004/0058090 A1 | 3/2004 | Waldfried et al. |
| 2004/0060917 A1 | 4/2004 | Liu et al. |
| 2004/0069410 A1 | 4/2004 | Moghadam et al. |
| 2004/0082163 A1 | 4/2004 | Mori et al. |
| 2004/0096672 A1 | 5/2004 | Lukas et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0166240 A1 | 8/2004 | Rhee et al. |
| 2004/0183226 A1 | 9/2004 | Newell et al. |
| 2004/0185679 A1 | 9/2004 | Ott et al. |
| 2004/0187790 A1 | 9/2004 | Bader et al. |
| 2004/0221871 A1 | 11/2004 | Fletcher et al. |
| 2004/0224496 A1 | 11/2004 | Cui et al. |
| 2005/0016687 A1* | 1/2005 | Shinriki et al. .......... 156/345.52 |
| 2005/0025892 A1 | 2/2005 | Satoh et al. |
| 2005/0045616 A1 | 3/2005 | Ishihara |
| 2005/0064726 A1 | 3/2005 | Reid et al. |
| 2005/0098553 A1 | 5/2005 | Devine et al. |
| 2005/0112282 A1 | 5/2005 | Gordon et al. |
| 2005/0156285 A1 | 7/2005 | Gates et al. |
| 2005/0161821 A1 | 7/2005 | Lee et al. |
| 2005/0164497 A1 | 7/2005 | Lopatin et al. |
| 2005/0170104 A1 | 8/2005 | Jung et al. |
| 2005/0191803 A1 | 9/2005 | Matsuse et al. |
| 2005/0194619 A1 | 9/2005 | Edelstein et al. |
| 2005/0196929 A1 | 9/2005 | Yuan et al. |
| 2005/0208758 A1 | 9/2005 | Lu et al. |
| 2005/0258164 A1 | 11/2005 | Hiramatsu et al. |
| 2005/0260357 A1 | 11/2005 | Olsen et al. |
| 2005/0260420 A1 | 11/2005 | Collins et al. |
| 2005/0272220 A1 | 12/2005 | Waldfried et al. |
| 2006/0018639 A1 | 1/2006 | Ramamurthy et al. |
| 2006/0024976 A1 | 2/2006 | Waldfried et al. |
| 2006/0027929 A1 | 2/2006 | Cooney et al. |
| 2006/0063662 A1 | 3/2006 | Hata et al. |
| 2006/0081186 A1 | 4/2006 | Shinriki et al. |
| 2006/0105106 A1 | 5/2006 | Balseanu et al. |
| 2006/0118817 A1 | 6/2006 | Haisma |
| 2006/0145304 A1 | 7/2006 | Boyanov et al. |
| 2006/0216839 A1 | 9/2006 | Shenesh et al. |
| 2006/0220251 A1 | 10/2006 | Kloster |
| 2006/0246672 A1 | 11/2006 | Chen et al. |
| 2006/0260538 A1 | 11/2006 | Ye et al. |
| 2007/0015355 A1 | 1/2007 | Lin et al. |
| 2007/0032024 A1 | 2/2007 | Peidous et al. |
| 2007/0042581 A1 | 2/2007 | Sano et al. |
| 2007/0054504 A1 | 3/2007 | Chen et al. |
| 2007/0105292 A1 | 5/2007 | Chen et al. |
| 2007/0107845 A1 | 5/2007 | Ishizawa et al. |
| 2007/0132054 A1 | 6/2007 | Arghavani et al. |
| 2007/0134821 A1 | 6/2007 | Thakur et al. |
| 2007/0134907 A1 | 6/2007 | Ikeda et al. |
| 2007/0189961 A1 | 8/2007 | Iacopi et al. |
| 2007/0196011 A1* | 8/2007 | Cox et al. ....................... 382/145 |
| 2007/0205788 A1 | 9/2007 | Natsuhara et al. |
| 2007/0222081 A1 | 9/2007 | Chen et al. |
| 2007/0224824 A1 | 9/2007 | Chen et al. |
| 2007/0243057 A1 | 10/2007 | Shimada et al. |
| 2007/0275569 A1 | 11/2007 | Moghadam et al. |
| 2007/0281497 A1 | 12/2007 | Liu et al. |
| 2007/0287240 A1 | 12/2007 | Chen et al. |
| 2008/0009141 A1 | 1/2008 | Dubois et al. |
| 2008/0020591 A1 | 1/2008 | Balseanu et al. |
| 2008/0132055 A1 | 6/2008 | Nguyen et al. |
| 2008/0199977 A1 | 8/2008 | Weigel et al. |
| 2008/0286697 A1 | 11/2008 | Verhaverbeke et al. |
| 2008/0305600 A1 | 12/2008 | Liao et al. |
| 2009/0017640 A1 | 1/2009 | Huh et al. |
| 2009/0039475 A1 | 2/2009 | Shioya |
| 2009/0060480 A1 | 3/2009 | Herchen |
| 2009/0277472 A1 | 11/2009 | Rivkin et al. |
| 2010/0267231 A1 | 10/2010 | Van Schravendijk et al. |
| 2010/0270004 A1 | 10/2010 | Landess et al. |

FOREIGN PATENT DOCUMENTS

| | | | |
|---|---|---|---|
| JP | 01-107519 | * | 4/1989 |
| JP | 62-229833 | | 10/1997 |
| JP | 11214364 A | | 8/1999 |
| JP | 63-307740 | | 12/2008 |
| KR | 2000-0043888 | | 7/2000 |
| WO | 2006/104583 | | 10/2006 |
| WO | 2006/127463 | | 11/2006 |

OTHER PUBLICATIONS

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

Schravendijk, et al., "UV Treatment of STI Films for Stress," Novellus Systems, Inc., U.S. Appl. No. 11/811,048, filed Jun. 7, 2007.

Arghavani et al., Strain Engineering in Non-Volatile Memories, *Reed Business Information*, 2007, six pages.

Notice of Allowance and Fee Due mailed May 22, 2006, from U.S. Appl. No. 10/672,311.

Allowed Claims from U.S. Appl. No. 10/672,311.

Notice of Allowance and Fee Due mailed Apr. 4, 2007, from U.S. Appl. No. 10/825,888.

Allowed Claims from U.S. Appl. No. 10/825,888.

Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.

Notice of Allowance and Fee Due mailed Oct. 10, 2006, from U.S. Appl. No. 10/800,377.

Allowed Claims from U.S. Appl. No. 10/800,377.

U.S. Office Action mailed Nov. 28, 2007, from U.S. Appl. No. 10/807,680.

R.J. Lewis, Sr., Hawley's Condensed Chemical Dictionary, 12th Edition, Van Nostrad Reinhold Co., New York, 1993 (no month), excerpts pp. 916-918 & 1123-1124.

Notice of Allowance and Fee Due mailed Dec. 20, 2005, from U.S. Appl. No. 10/860,340.

Allowed Claims from U.S. Appl. No. 10/860,340.

U.S. Office Action mailed Dec. 12, 2007, from U.S. Appl. No. 11/146,456.

Shaviv et al., "UV Treatment to Improve Integrity and Performance of Front End Dielectrics," Novellus Systems, Inc., U.S. Appl. No. 11/622,409, filed Jan. 11, 2007.

van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.

Shrinivassan et al., "Multi-Station Sequential Curing of Dielectric Films," Novellus Systems, Inc., U.S. Appl. No. 11/688,695, filed Mar. 20, 2007.

Varadarajan et al., "A Cascaded Cure Approach to Fabricate Highly Tensile Silicon Nitride Films," Novellus Systems, Inc., U.S. Appl. No. 11/897,838, filed Aug. 31, 2007.

Van den Hoek, et al., "VLSI Fabrication Processes for Introducing Pores Into Dielectric Materials," Novellus Systems, Inc., U.S. Appl. No. 11/606,340, filed Nov. 28, 2006.

U.S. Office Action mailed Jan. 10, 2008, from U.S. Appl. No. 11/622,423.

Bhadri Varadarajan et al., "Development of High Stress SiN Films for Use with Strained Silicon Technologies"; Proc. 68th Symp. on Semiconductors and IC Tech.; Kyoto 2005.

Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.
Schulberg et al., "System for Deposition of Mesoporous Materials," U.S. Appl. No. 10/295,965, filed Nov. 15, 2002, 64 Pages.
Watkins et al., "Mesoporous Materials and Methods," U.S. Appl. No. 10/301,013, filed Nov. 21, 2002, 34 Pages.
Justin F. Gaynor, "In-Situ Treatment of Low-K Films With a Silylating Agent After Exposure To Oxidizing Environments," U.S. Appl. No. 10/056,926, filed Jan. 24, 2002, 34 Pages.
Tipton et al., "Method of Porogen Removal From Porous Low-K Films Using UV Radiation", Novellus Systems, Inc., U.S. Appl. No. 10/672,311, filed Sep. 26, 2003, pp. 1-27.
Jan, C.H., et al, *90NM Generation, 300mm Wafer Low k ILD/Cu Interconnect Technology*, 2003 IEEE Interconnect Technology Conference.
Gangpadhyay et al., "The First International Surface Cleaning Workshop," Northeastern University, Nov. 11-14, 2002.
Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.
Tipton et al., "Method Of Porogen Removal From Porous Low-K Films Using UV Radiation", U.S. Appl. No. 10/672,311, filed Sep. 26, 2003, Office Action dated Sep. 7, 2004.
Tipton et al., "Method Of Porogen Removal From Porous Low-K Films Using UV Radiation", U.S. Appl. No. 10/672,311, filed Sep. 26, 2003, Office Action dated Dec. 28, 2004.
Peter Singer, "New Materials and Designs to Improve Transistor Performance", Apr. 1, 2004, Semiconductor International.
Ghani et al, "A 90nm High Volume Manufacturing Logic Technology Featuring Novel 45nm Gate Length Strained Silicon CMOS Transistors", IEEE, © 2003.
Bhadri N. Varadarajan, "Tensile Silicon Nitride—P1264 NESL", C & F Study, Aug. 21, 2003.
Niu et al., "Methods For Improving The Cracking Resistance Of Low-K Dielectric Materials", U.S. Appl. No. 10/860,340, Office Action dated Mar. 2, 2005.
Niu et al., "Methods For Improving The Cracking Resistance Of Low-K Dielectric Materials", U.S. Appl. No. 10/860,340, Final Office Action dated Jun. 13, 2005.
Varadarajan et al., "Tensile Dielectric Films Using UV Curing", U.S. Appl. No. 10/972,084, filed Oct. 22, 2004.
Draeger et al., "Creation of Porosity In Low-K Films by Photo-Disassociation of Imbedded Nanoparticles," U.S. Appl. No. 11/146,456, filed Jun. 6, 2005.
Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.
U.S. Office Action mailed Jul. 13, 2005, from U.S. Appl. No. 10/672,311.
U.S. Office Action mailed Dec. 20, 2005, from U.S. Appl. No. 10/672,311.
U.S. Office Action mailed Mar. 29, 2006, from U.S. Appl. No. 10/800,377.
Kelman et al., "Method for Reducing Stress in Porous Dielectric Films", U.S. Appl. No. 11/369,311, filed Mar. 6, 2006.
U.S. Office Action mailed Jun. 28, 2006, from U.S. Appl. No. 10/825,888.
U.S. Office Action mailed Dec. 27, 2006, from U.S. Appl. No. 10/825,888.
Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.
Kamian et al., "Ultra Violet Light Treatment Load Lock for Dielectric Films," Novellus Systems, Inc., U.S. Appl. No. 11/561,834, filed Nov. 20, 2006, pp. 1-25.
Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.
Vancouver et al., "PECVD Methods for Producing Ultra Low-K Dielectric Films Using UV Treatment," U.S. Appl. No. 11/608,056, filed Dec. 7, 2006, pp. 1-34.
Tarafdar et al., "Sequential Deposition/Anneal Film Densification Method", Novellus Systems, Inc., filed Sep. 11, 2006, U.S. Appl. No. 11/519,445, pp. 1-37.
Schravendijk, "UV Treatment of FSG Films to Improve Film Stability," Novellus Systems, Inc., U.S. Appl. No. 11/622,423, filed Jan. 11, 2007, pp. 1-31.
U.S. Office Action mailed Apr. 3, 2008, from U.S. Appl. No. 10/982,654.
U.S. Appl. No. 61/050,880, filed May 6, 2008, Rivkin et al.
U.S. Appl. No. 11/129,266, filed May 12, 2005, Landess et al.
U.S. Appl. No. 11/546,189, filed Oct. 10, 2006, Doble et al.
U.S. Appl. No. 11/608,185, filed Dec. 7, 2006, Rivkin et al.
U.S. Appl. No. 11/851,310, filed Sep. 6, 2007, Shrinivisan et al.
U.S. Appl. No. 11/937,364, filed Nov. 8, 2007, Nordin et al.
U.S. Appl. No. 12/140,196, filed Jun. 16, 2008, Gage et al.
U.S. Appl. No. 12/333,239, filed Dec. 11, 2008, Gage et al.
U.S. Office Action mailed Jun. 16, 2008, from U.S. Appl. No. 11/546,189.
U.S. Final Office Action mailed Oct. 16, 2008, from U.S. Appl. No. 11/546,189.
U.S. Office Action mailed Jul. 18, 2006, from U.S. Appl. No. 11/184,101.
Notice of Allowance and Fee Due mailed Jan. 25, 2007, from U.S. Appl. No. 11/184,101.
Allowed Claims from U.S. Appl. No. 11/184,101.
U.S. Appl. No. 11/811,048, Notice of Allowance mailed Oct. 8, 2009.
U.S. Appl. No. 11/975,473, Office Action mailed Oct. 9, 2009.
Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.
U.S. Appl. No. 11/622,409, Office Action mailed Nov. 5, 2009.
U.S. Appl. No. 11/519,445, Office Action mailed Nov. 4, 2009.
U.S. Appl. No. 10/972,084, Office Action mailed Nov. 27, 2009.
Haverkamp, et al., "Multi-Station Sequential Curing of Dielectric Films," Novellus Systems, Inc., U.S. Appl. No. 11/977,792, filed Oct. 25, 2007.
Haverkamp, et al., "Progressive Uv Cure," Novellus Systems, Inc., U.S. Appl. No. 12/210,060, filed Sep. 12, 2008.
U.S. Appl. No. 11/696,102, Office Action mailed Dec. 22, 2009.
U.S. Office Action mailed Sep. 19, 2008, from U.S. Appl. No. 11/824,049.
U.S. Final Office Action mailed Jul. 10, 2008, from U.S. Appl. No. 10/807,680.
U.S. Final Office Action mailed Jul. 25, 2008, from U.S. Appl. No. 11/146,456.
U.S. Final Office Action mailed Jul. 9, 2008, from U.S. Appl. No. 10/982,654.
U.S. Office Action mailed May 14, 2008, from U.S. Appl. No. 11/519,445.
U.S. Office Action mailed Jul. 23, 2008, from U.S. Appl. No. 11/622,423.
U.S. Appl. No. 11/590,661, Office Action mailed Apr. 6, 2009.
U.S. Appl. No. 11/811,048, Office Action mailed Mar. 19, 2009.
Rodriquez, J.A. et al., "Evolution of the mechanical stress on PECVD silicon oxide films under thermal processing", Journal of Materials Science Letters 19, 2000, pp. 1399-1401.
U.S. Appl. No. 11/606,340, Office Action mailed Feb. 5, 2009.
U.S. Appl. No. 11/824,049, Office Action mailed Mar. 19, 2009.
U.S. Appl. No. 11/824,049, Notice of Allowance mailed Jun. 22, 2009.
U.S. Appl. No. 11/824,049, Allowed Claims.
U.S. Appl. No. 10/982,654, Office Action mailed Dec. 4, 2008.
U.S. Appl. No. 11/519,445, Office Action mailed Dec. 10, 2008.
U.S. Appl. No. 10/972,084, Office Action mailed Dec. 30, 2008.
Draeger et al., "Creation of Porosity In Low-K Films by Photo-Disassociation Of Imbedded Nanoparticles," U.S. Appl. No. 12/369,384, filed Feb. 11, 2009.
U.S. Appl. No. 11/688,695, Office Action mailed Jun. 11, 2009.
U.S. Appl. No. 11/696,102, Office Action mailed Jul. 1, 2009.

Yu, J.J. et al., "UV Annealing of Ultrathin Tantalum Oxide Films", Applied Surface Science, V 186 (2002), 57-63.
U.S. Appl. No. 11/811,048, Notice of Allowance mailed Aug. 17, 2009.
U.S. Appl. No. 11/811,048, Allowed Claims.
U.S. Appl. No. 11/369,311, Office Action mailed Aug. 20, 2009.
U.S. Appl. No. 11/608,056, Office Action mailed Aug. 20, 2009.
Varadarajan et al., "Tensile dielectric films using UV curing", U.S. Appl. No. 10/972,084, filed Oct. 22, 2004.
P. Morin et al., "Tensile contact etch stop layer for nMOS performance enhancement: influence of the film morphology", ECS meeting, May 2005.
Takagi et al., "High Rate Deposition of a-Si:H and a-SiN$_x$:H by VHF PECVD", Vacuum, 51, 1998.
Smith, D.L et al., "Mechanism of SiN$_3$-SiH$_4$ Llasma", J. Electrochem. Soc., vol. 137 (2) 1990.
Nagayoshi et al., "Residual Stress of a Si$_{l-x}$N$_x$: H Films Prepared By Afterglow Plasma Chemical Vapor Deposition Technique", Jpn. J. Appl. Phys. vol. 31 (1992) pp. L867-L869 Part 2, No. 7A, Jul. 1, 1992.
Varadarajan et al., "Use of VHF RF plasma to deposit high tensile stress films with improved film properties for use in strained silicon technology", U.S. Appl. No. 11/975,473, filed Oct. 18, 2007.
U.S. Appl. No. 11/975,473, Office Action mailed Oct. 28, 2008.
U.S. Appl. No. 11/975,473, Office Action mailed Mar. 23, 2009.
Jiang et al., "Tensile dielectric films using UV curing", U.S. Appl. No. 11/899,683, filed Sep. 7, 2007.
U.S. Appl. No. 11/899,683, Office Action mailed May 29, 2009.
U.S. Appl. No. 11/519,445, Office Action mailed Aug. 26, 2009.
U.S. Appl. No. 11/622,409, Office Action mailed Jul. 1, 2009.
Haverkamp et al., "Enhancing adhesion of cap layer films", U.S. Appl. No. 11/731,581, filed Mar. 30, 2007.
U.S. Appl. No. 11/731,581, Office Action mailed Jun. 1, 2009.
U.S. Appl. No. 11/602,564, "Method of Eliminating Small Bin Defects in High Throughput TEOS Films", Henri et al., filed Nov. 20, 2006.
U.S. Appl. No. 11/602,564, Office Action mailed Feb. 15, 2008.
U.S. Appl. No. 11/602,564, Office Action mailed Sep. 4, 2008.
U.S. Appl. No. 11/602,564, Office Action mailed Mar. 20, 2009.
U.S. Appl. No. 12/001,348, "Tunable-Illumination Reflector Optics for UV Cure System", Bryan Bolt, filed Dec. 10, 2007.
U.S. Appl. No. 12/008,149, "Measuring in-situ UV intensity in UV cure tool", Eugene Smargiassi, filed Jan. 8, 2008.
U.S. Appl. No. 12/008,149, Office Action mailed Mar. 17, 2010.
U.S. Appl. No. 12/726,263, "Apparatus for UV Damage Repair of Low K Films Prior to Copper Barrier Deposition", van Schravendijk, et al., filed Mar. 17, 2010.
U.S. Appl. No. 11/937,364, Office Action mailed Apr. 9, 2010.
U.S. Appl. No. 11/129,266, Office Action mailed Feb. 20, 2009.
U.S. Appl. No. 11/129,266, Office Action mailed Oct. 28, 2009.
U.S. Appl. No. 11/608,185, Office Action mailed Apr. 26, 2010.
U.S. Appl. No. 11/751,584, "Cast pedestal with heating element on coaxial heat exchanger", Shrinivasan et al., filed May 21, 2007.
U.S. Appl. No. 11/851,310, Office Action mailed Jun. 8, 2010.
U.S. Appl. No. 12/341,943, "Atomic layer removal for high aspect ratio gapfill", van Schravendijk et al., filed Dec. 22, 2008.
U.S. Appl. No. 61/122,308, "Conductively cooled process for wide temperature range processes", Nieh et al., filed Dec. 12, 2008.
U.S. Appl. No. 12/341,943, Office Action mailed Jun. 11, 2010.
International Search Report and Written Opinion for application No. PCT/US2009/067040, mailed Aug. 2, 2010.
U.S. Appl. No. 11/608,185, Office Action mailed Nov. 26, 2010.
U.S. Appl. No. 12/341,943, Office Action mailed Dec. 23, 2010.
U.S. Appl. No. 12/333,239, Final Office Action mailed Dec. 27, 2010.
Notice of Allowance for U.S. Appl. No. 11/851,310, mailed Jan. 5, 2011.
Allowed Claims for U.S. Appl. No. 11/851,310, as of mailed Jan. 5, 2011.
U.S. Appl. No. 11/937,364, Final Office Action mailed Dec. 27, 2010.
U.S. Appl. No. 12/008,149, Notice of Allowance mailed Nov. 19, 2010.
U.S. Appl. No. 11/369,311, Office Action mailed Jan. 5, 2010.
U.S. Appl. No. 11/688,695, Final Office Action mailed Dec. 31, 2009.
U.S. Appl. No. 11/590,661, Final Office Action mailed Jan. 25, 2010.
U.S. Appl. No. 11/656,661, Office Action mailed Jan. 22, 2010.
U.S. Appl. No. 11/731,581, Office Action mailed Feb. 4, 2010.
U.S. Appl. No. 11/899,683, Office Action mailed Feb. 8, 2010.
Wu, et al., "Methods for Fabricating Zeolite Nano-Crystal Based Low-K Dielectric Films Containing Si (CxHy)n Groups and Treating Films by Ultra-Violet Thermal Processing," Novellus Systems, Inc., U.S. Appl. No. 12/172,089, filed Jul. 11, 2008.
U.S. Appl. No. 11/977,792, Office Action mailed Mar. 9, 2010.
Chaabouni, H. et al., "Porous SiOCH Ultra Low-K recovery treatments after direct CMP process", Advanced Metallization Conference, Sep. 2008.
Chaabouni, H. et al., "Sidewall restoration of porous ultra low-$k$ dielectrics for sub-45 nm technology nodes", Microelectronic Engineering 84 (2007).
Huang, H. et al., "O2 Plasma Damage and Dielectric Recoveries to Patterned CDO Low-k Dielectrics", Advanced Metallization Conference, Sep. 2008.
U.S. Appl. No. 11/608,056, Office Action mailed Mar. 23, 2010.
U.S. Appl. No. 11/975,473, Office Action mailed Mar. 25, 2010.
Takagi et al., "High Rate Deposition of a-SiN$_x$:H by VHF PECVD", Mat. Res. Soc. Symp. Proc. vol. 467, 1997, Materials Research Society.
U.S. Appl. No. 11/519,445, Notice of Allowance mailed Apr. 21, 2010.
U.S. Appl. No. 11/519,445, Allowed Claims.
U.S. Appl. No. 11/561,834, Office Action mailed May 21, 2010.
U.S. Appl. No. 12/646,830, "UV and Reducing Treatment for K Recovery and Surface Clean in Semiconductor Processing", Varadarajan, Bhadri et al., filed Dec. 23, 2009.
U.S. Appl. No. 12/840,192, "Sequential deposition / anneal film densification method", Tarafdar et al., filed Jul. 20, 2010.
U.S. Appl. No. 11/688,695, Office Action mailed Jul. 23, 2010.
U.S. Appl. No. 11/590,661, Notice of Allowance mailed Aug. 6, 2010.
U.S. Appl. No. 11/590,661, Allowed Claims.
U.S. Appl. No. 11/656,661, Final Office Action mailed Aug. 24, 2010.
U.S. Appl. No. 12/172,089, Office Action mailed Sep. 13, 2010.
Li, Shuang et al., "Organic-functionalized pure-silica-zeolite MFI low-$k$ films", Chem. Mater. 2005, 17, Mar. 9, 2005, pp. 1851-1854.
U.S. Appl. No. 11/731,581, Final Office Action mailed Sep. 2, 2010.
U.S. Appl. No. 10/972,084, Office Action mailed Oct. 15, 2010.
U.S. Appl. No. 11/977,792, Office Action mailed Oct. 25, 2010.
U.S. Appl. No. 11/975,473, Office Action mailed Nov. 1, 2010.
U.S. Appl. No. 11/608,056, Notice of Allowance mailed Nov. 2, 2010.
U.S. Appl. No. 11/608,056, Allowed Claims.
U.S. Appl. No. 12/566,514, Office Action mailed Jan. 11, 2011.
U.S. Appl. No. 11/561,834, Final Office Action mailed Dec. 3, 2010.
U.S. Appl. No. 11/696,102, Office Action mailed Jan. 26, 2011.
U.S. Appl. No. 11/688,695, Office Action mailed Feb. 1, 2011.
U.S. Final Office Action mailed Jul. 25, 2008, from U.S. Appl. No. 11/146,456.
U.S. Appl. No. 11/146,456, Notice of Allowance mailed Nov. 10, 2008.
U.S. Appl. No. 11/146,456, Supplemental Notice of Allowance mailed Dec. 15, 2008.
U.S. Office Action mailed Feb. 22, 2011, from U.S. Appl. No. 12/369,384.
U.S. Appl. No. 12/001,348 Office Action mailed May 20, 2011.

* cited by examiner

SINGLE-CHAMBER SEQUENTIAL CURING OF SEMICONDUCTOR WAFERS

BACKGROUND

As IC device geometries shrink, development of low-k inter-metal dielectrics (IMDs) becomes more important. Current production processes use dense films that have a k-value between 3 and 4. These films are typically deposited using Plasma Enhanced Chemical Vapor Deposition (PECVD) processes and are typically made from either fluoro-silicate glass (FSG) or organo-silicate glass (OSG). Devices in current production range between 90 nm and 120 nm in gate width. The Semiconductor Industry roadmap calls for further shrinking these device geometries to 65 nm, then 45 nm and beyond over the remainder of this decade.

As device geometries shrink further, there is a need for IMD films with k-values under 2.7. Successfully developing a film of such low capacitance requires including porosity in the film. To this end, ultra-low-k (ULK) IMD films of porous OSG have been developed. These ULK films are deposited using PECVD techniques, wherein an OSG backbone and a pore generator (porogen) are co-deposited on a semiconductor wafer. Various techniques such as thermal, ultraviolet (UV) and electron beam curing are then used to drive the porogen out of the composite film leaving behind a porous OSG matrix. The resulting porous film exhibits k-values ranging from 2.0 to 2.5 due to the presence of pores containing air, which by definition has a k of 1.0.

However, the inclusion of pores in these films renders them softer and mechanically weaker than dense OSG films. Mechanical strength and hardness are necessary for the film to survive subsequent processing steps from chemical mechanical polishing to the various wire-bonding steps during chip packaging. Therefore, to compensate for the mechanical weakness introduced by the pores in these ULK films, the OSG backbone needs to be strengthened. Further processing of these wafers using UV radiation and electron beams increases cross-linking, which strengthens the film. Thermal curing has no further effect on the mechanical properties of the film after the porogen has been driven out, and therefore cannot be used to harden or strengthen the film.

However, the process of curing ULK films on semiconductor wafers is time consuming. Typical cure times may exceed 5 minutes. Two ways to decrease cure time are by increasing wafer temperature and increasing UV intensity. However, any increase in wafer temperature is limited due to the effect of high temperature on the underlying layers, specifically copper. Higher temperatures cause copper agglomeration, a phenomenon also referred to as "copper hillock" formation. The potential for increasing UV intensity is limited by the commercial availability of UV lamps themselves. The most intense source of UV radiation continues to be traditional mercury-vapor lamps. However, these lamps require extensive air-cooling, provision for which limits the number of lamps that can be packaged above a standard semiconductor wafer.

In addition, curing with commercially available mercury-vapor UV lamps often results in areas of non-uniformity on the wafer because the tubular geometry of these lamps is not optimized for uniform illumination of a wafer. Further, there are significant variations in UV output from lamp to lamp.

Mercury-vapor lamps exhibit another significant shortcoming, namely that in order to generate said vapor, the lamps must operate at significantly higher temperatures than is desired for processing ULK films. Typical commercial lamp systems cause the lamp envelope to reach temperatures between 800° and 900° C. This requires sophisticated wafer-temperature control schemes wherein the infra-red (IR) energy that is radiatively coupled to the wafer from the lamp envelopes needs to be removed while maintaining the wafer at the desired operating temperature, typically in the range between 250° and 400° C.

Therefore, there is a need for inventions that improve uniformity of curing and wafer throughput given the limitations in both the wafer temperature and UV intensity from available lamps.

SUMMARY OF THE INVENTION

The present invention addresses this need by providing apparatuses for single-chamber sequential curing of semiconductor wafers. The chambers include multiple curing stations, each of which features its own UV light source. The chamber of this invention thus cures the wafers by sequentially exposing each wafer to each of the light sources. Wafer throughput is increased by curing multiple wafers concurrently in a single chamber. Areas of non-uniformity due to any one light source are averaged out over exposure to multiple light sources. In some embodiments, the wafers remain stationary at each station with respect to its light source during exposure. In other embodiments, there is relative movement between the light source and the wafers during exposure. The invention also provides chambers that may be used to independently modulate the cross-linking, density and increase in stress of a cured material by providing independent control of the wafer temperature, UV wavelength and UV intensity at each station.

One aspect of the present invention relates to an apparatus for curing a plurality of semiconductor wafers. The apparatus includes a chamber housing, one or more wafer supports, a plurality of UV light sources, and a mechanism to sequentially expose each wafer to each of the plurality of light sources.

In some embodiments, the chamber also includes a heat transfer component for controlling the temperature of the wafer independent of the UV light intensity. In preferred embodiments, the chamber includes a uniform heat source and/or sink to control the wafer temperature. According to various embodiments, heating and cooling elements may be embedded within the wafer support or within a stationary block. The wafer temperature is coupled to the support or block. In some embodiments, decoupling the temperature of the wafer from the UV intensity is facilitated by equipping each light source with IR filtering optical elements. In the preferred embodiment, this decoupling is achieved by equipping the UV light source or lamp with mirrors that transmit IR, but reflect the useful UV radiation towards the wafer.

In some embodiments, the wafer support is a plurality of pedestals. Each pedestal may be equipped with its own heating and/or cooling elements or all pedestals may be connected to a common heating block. In other embodiments, the wafer support is a stationary pedestal block containing heating and/or cooling elements. In still other embodiments the wafer support is a carousel. Heating and/or cooling elements may be embedded in the carousel. Alternatively, the carousel holds the wafers so that wafers are thermally coupled to a common heating block. Heating and cooling elements include electrical lines and cooling channels.

In preferred embodiments, the UV light sources are medium pressure mercury lamps. In preferred embodiments, there are between 4 and 6 stations, with 1-5 lamps per station. The lamps and/or stations may be arranged in any arrangement that allows for sequential exposure. In preferred embodiments, the stations are arranged in a circular or U-shaped arrangement. According to various embodiments, the UV light sources may consist of pulsed Xenon lamps, excimer lamps, plasma discharge lamps, or any other radiation source that provides sufficient energy in the ultraviolet spectrum. In some embodiments, the chamber may be equipped with different kinds of lamps at various stations, this arrangement being optimized to provide for independent modulation of various desirable properties in a ULK film. Desirable properties may include, k-value, stress, mechanical hardness, elastic modulus, chemical composition, and density.

In some embodiments, the relative orientation between a wafer and the light source changes from light source to light source. In other embodiments the plurality of light sources to which the wafer is sequentially exposed may irradiate it at different wavelengths, each wavelength tailored to achieve a specific effect on the wafer and the properties of the film on top.

Another aspect of the invention relates to a chamber for curing semiconductor wafers that uses flood illumination. The chamber includes a chamber housing, a wafer support, a plurality of UV flood lamp sets and a mechanism to sequentially expose each wafer to each of the plurality of lamp sets; wherein each wafer is stationary with respect to the set of lamps during exposure.

In some embodiments, the wafer support comprises a plurality of stationary pedestals and the mechanism to sequentially expose each wafer to the plurality of lamp sets is an indexer. In other embodiments, the wafer support comprises a stationary heating block and an indexing mechanism to sequentially expose each wafer to the plurality of lamp sets. The indexing mechanism includes an indexer plate attached to a mechanism that imparts rotational and axial motion to the plate. In other embodiments the wafer support is a carousel and the mechanism to sequentially expose each wafer to the plurality of lamp sets rotates the carousel.

In preferred embodiments, each UV flood lamp set is equipped with a parabolic cold mirror.

Another aspect of the invention relates to a chamber for curing a plurality of semiconductor wafers that uses focused illumination. The chamber includes a chamber housing, a wafer support, a plurality of UV focused lamp sets, and a mechanism to sequentially expose each wafer to each of the UV focused lamp sets, wherein there is continuous or substantially continuous relative movement between each wafer and the lamp sets during exposure.

In some embodiments, the wafer support is a carousel and the mechanism to sequentially expose each wafer to the plurality of focused lamp sets rotates the carousel. In some embodiments, heating and/or cooling elements are embedded within the carousel. In a preferred embodiment, the carousel suspends the wafers above a stationary heating block.

In preferred embodiments, each UV focused light source is equipped with an elliptical cold mirror.

Another aspect of this invention consists of lamp arrangements wherein there is no direct line of sight between the lamps and the wafer. This arrangement includes a reflector that receives output radiation from the lamps and redirects reflected radiation towards the wafer. In preferred embodiments this reflector is made from "cold mirror" components, i.e., wherein the useful wavelengths are reflected to the wafer and those that have no purpose are transmitted through the reflector. In some embodiments, the reflectors are supported by actively cooled absorber components that are coated with special materials that efficiently absorb energy in those wavelength bands that the reflectors transmit.

BRIEF DESCRIPTION OF THE DRAWINGS

FIG. 1b is a schematic illustration schematic illustration showing a side view of the multi-station sequential cure chamber shown in FIG. 1a.

FIG. 2b is a schematic illustration schematic illustration showing a side view of the multi-station sequential cure chamber shown in FIG. 2a.

DETAILED DESCRIPTION OF THE PREFERRED EMBODIMENTS

Introduction

Figure 1A:
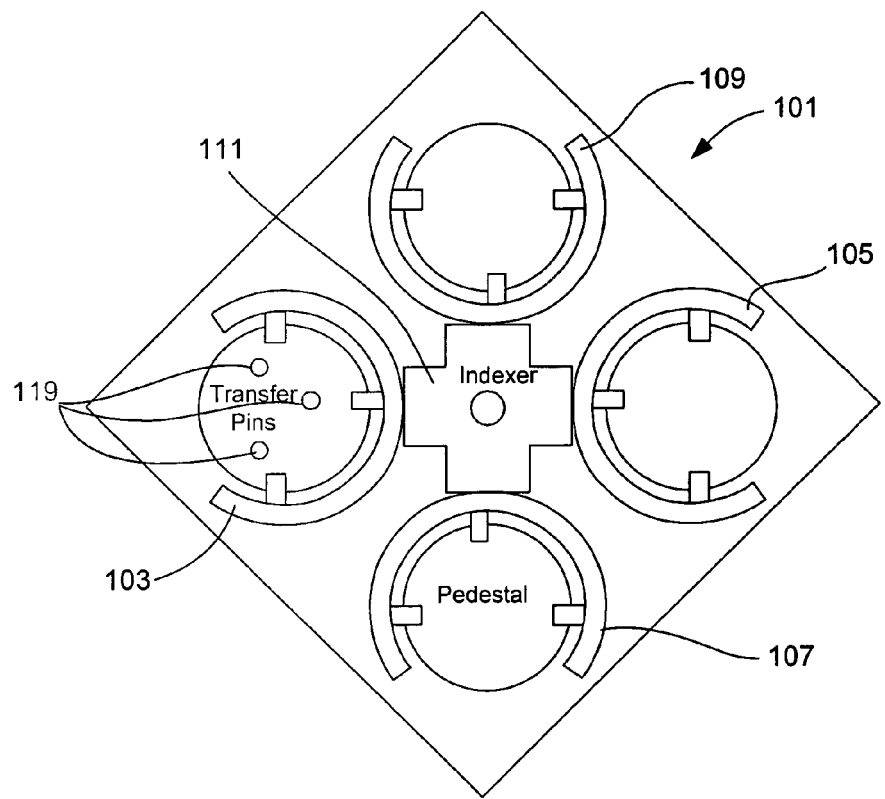
FIG. 1a is a schematic illustration showing a top view of a multi-station sequential cure chamber according to one embodiment of the present invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention. While the use of Ultraviolet (UV) radiation has been employed for purposes of illustrating the present invention, other forms of radiation (i.e., from other parts of the electromagnetic spectrum) can also be practiced using the same essential elements described herein.

UV curing of semiconductor wafers has many applications including removing porogens, strengthening porous OSG backbones, improving dense non-porous OSG film properties, curing nitrides and oxides, extracting water produced in dielectric (e.g., silicon oxide) deposition, densification of dielectric materials, and increasing stress in dielectric films (for, e.g., strained gates).

As discussed above, UV curing is sometimes used to drive out porogen from composite porogen-OSG films, leaving a porous OSG matrix with a low k-value, generally between 2.0 and 2.5. UV curing has also been employed to lower the k-value of other dielectric materials such as oxides deposited by pulse deposition layer (PDL) processes.

In addition to driving out fluids, the curing process increases cross-linking of the bonds in the OSG matrix, results that may have several side effects that may be beneficial to the resulting electronic devices. Side effects of this cross-linking may include increased stress and strain of the materials, and densification the material. Thus, in addition to porogen removal, UV curing may also be used for applications where increased stress, cross-linking, and/or density is desired. UV curing substantially increases the cross-linking of the OSG films, which strengthens the films, and has been used to strengthen porous and non-porous films. Both dense and porous low-k films show significant improvement in both mechanical and electrical properties after UV curing. UV curing may be also useful for increasing density of other dielectric films, such as ashable hard masks. In addition, UV curing is employed in applications for which high tensile strength is desirable. For example, for films at the transistor level, UV curing is used to produce silicon nitride film with high tensile strength. The high stresses in the films modulate strained silicon, enabling higher device speeds with minimal process cost.

Curing semiconductor wafers takes place in a chamber filled with a gas. A wafer is placed in the chamber and exposed to UV radiation. As discussed above, the process of curing ULK films on semiconductors can be time-consuming with cure times exceeding five minutes. Also, the geometry of commonly available UV radiation sources results in non-uniform irradiation of the wafer surface, thereby causing variations in the cure efficacy at various locations.

Sequential Curing

The present invention provides chambers for sequential curing of semiconductor wafers. The chambers include multiple UV light sources and the wafers are cured by sequential exposure to each of the light sources. Sequential exposure to multiple light sources allows multiple wafers to be cured concurrently in a single chamber. Total wafer throughput is increased by the number of light sources in the chamber. In a preferred embodiment, there are about 2-20 stations, each containing 1-20 lamps. In a particularly preferred embodiment, there are 4-6 stations, each containing 1-5 lamps. The stations and light sources may be organized in any arrangement suitable for sequential exposure. Suitable arrangements include both closed and open arrangements, such as circular arrangements and U-shaped arrangements.

Figure 1B:
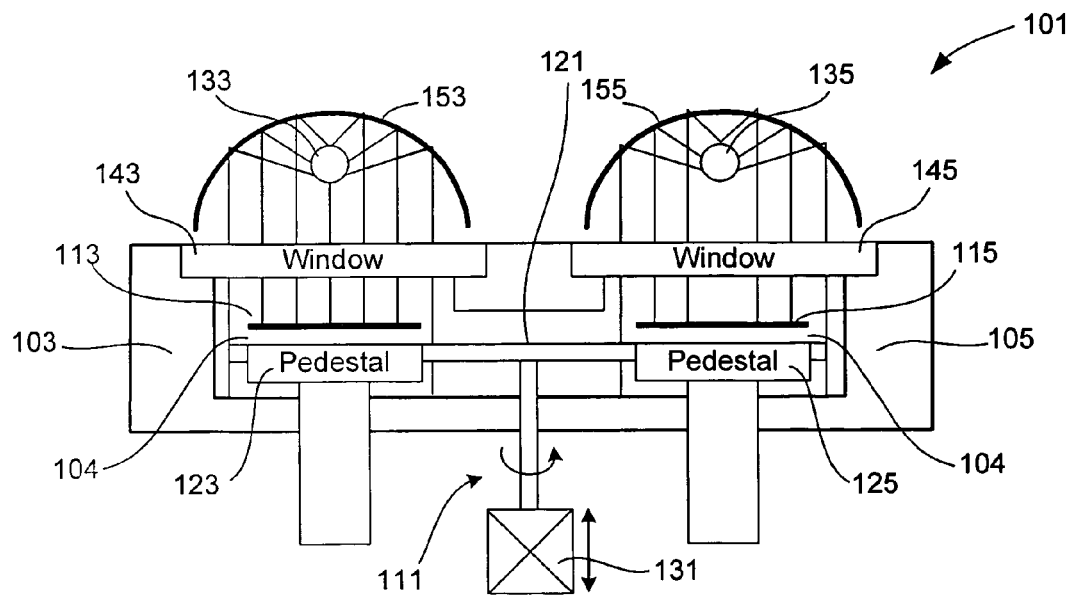

FIGS. 1a and 1b are schematic illustrations showing a multi-station sequential cure chamber according to one embodiment of the present invention. FIG. 1a shows multiple cure stations 103, 105, 107 and 109 of chamber 101, each of which accommodates a wafer. FIG. 1b is a side view of the chamber showing stations 105 and 103 and wafers 113 and 115. Each wafer is located on or above a wafer support, in this embodiment, pedestals 123 and 125. In some embodiments a chuck may be used to hold the wafer in place during the curing process. The wafer does not necessarily directly contact the chuck and/or pedestal. For example, the wafer may be floated above the wafer support on pins for example. UV radiation from UV light sources 133 and 135 passes through windows 143 and 145. Some of the light is incident after being reflected from reflectors 153 and 155. Wafers 103 and 105 are then exposed to the radiation. The apparatus also contains a mechanism to sequentially advance the wafers from station to station. In this embodiment, indexer 111 lifts and moves each wafer from station to station.

In operation, each wafer is sequentially exposed to each UV light source. For example, wafer 113 is exposed to UV radiation from UV light source 133 for a set period of time. At the same time, wafer 115 is exposed to UV radiation from UV light source 135. Indexer 111 then advances wafer 113 to station 107 and wafer 115 to station 109 for exposure to UV light sources associated with those stations. Wafers initially at stations 107 and 109 are similarly advanced to stations 105 and 103, respectively. The process is then repeated. In this manner, the apparatus provides sequential curing of multiple wafers. In some embodiments, a cured wafer is transferred out and a new wafer is introduced at station 109 after each cycle. In other embodiments, all wafers may be loaded into the chamber before any exposure and transferred out after each wafer has been exposed to all of the light sources. Specific details of implementing the embodiment shown in FIGS. 1a and 1b are discussed further below.

An apparatus such as that in FIG. 1a with four stations is able to cure four wafers in the time it would take a conventional chamber to cure one wafer. Apparatuses of the present invention are thus able to reduce the per-wafer curing time by a factor of the number of stations, and thereby increase the total wafer throughput by employing multiple cure light sources.

Independent Control of Wafer Temperature and UV Intensity

The sequential curing chambers of the present invention also provide independent control of wafer temperature and UV intensity. Typically, curing chambers use broad intensity lights, such as mercury lamps. Medium pressure mercury vapor lamps emit radiation of wavelength from about 200 nm to the far-IR range. The wafer is exposed to visible, UV and IR radiation. The IR radiation increases the wafer temperature significantly. In such lamp systems, adjustment in radiation output is frequently achieved through modulation of electrical power that is fed to the lamps. This may occur either directly through adjustment of electrical voltage in arc-discharge lamps or by modulation of microwave power in those systems that use microwave plasma discharge. In either case, an increase in desirable UV output is accompanied by a corresponding increase in undesirable IR and visible energy output. Thus, the wafer temperature is closely coupled to the UV intensity in conventional chambers. In addition, because the lamps typically do not illuminate the surface of the wafer uniformly, wafer temperature is highly non-uniform across the surface of the wafer.

It is desirable to control the wafer temperature and provide high UV intensity without requiring sophisticated filtering systems to remove the IR radiation. The ability to control wafer temperature independently of the UV intensity (and vice versa) allows for modulating certain side-effects of the curing process in preference to one another. The curing process has several side effects that may be beneficial to materials. As mentioned above, side effects of curing include increased stress and strain of the materials, increased cross-linking of the bonds of the material and densification the material. It is often desirable to increase one of these effects relative to the others for a particular application. For example, for dense low-k carbon-doped oxide films, it is desirable to increase the mechanical properties of the films by cross-linking without a large increase in the stress of the film. For silicon nitride films, a large increase in the stress is desirable. Any of these effects can be modulated in preference to the others by decoupling control of the wafer temperature from UV intensity.

The present invention provides chambers that are capable of modulating these effects by providing independent control of the wafer temperature and the UV intensity. According to various embodiments, the wafer temperature and UV intensity are decoupled by reducing the amount of IR radiation on the wafer and/or providing independent heat transfer mechanisms to and from the wafer.

Heat Transfer Component

As discussed above, IR radiation from the light source increases wafer temperature. The present invention decouples the wafer temperature from the light source and couples it to a uniform and easily controlled source. Preferred wafer temperatures range from room temperature to 550° C. Particularly preferred temperatures range from 250° C. to 400° C. In some embodiments, the pedestal or other wafer support provides the uniform heat source. In other embodiments, the wafer support suspends the wafers above, but very close to, the uniform heat source, or otherwise holds the wafers so that they are thermally coupled to the uniform source.

According to various embodiments the heat transfer component may include electrical heaters embedded within the pedestal or other wafer support or a heater block located near the support. In preferred embodiments wherein the wafer support is stationary, the wafer support contains a heat transfer component. In preferred embodiments where the wafer support comprises a carousel, the heat transfer component is preferably a heater block suspended below the carousel. Standard resistive heaters used to heat pedestals in CVD chambers are well-known to one skilled in the art may be used.

There are two main heat transfer mechanisms that heat transfer component or source should compensate for in addition to heating the wafer to the desired temperature: IR radiation from the light source and heat loss to the chamber walls. In some embodiments the heat transfer component may include coolant channels to permit the flow of a heat transfer liquid or pressurized gas if an additional cooling mechanism is required beyond the natural heat loss to the walls. In some embodiments, the chamber is configured to optimize the heat transfer from the wafer support to the chamber walls. The heat transfer component may include a surface coating designed to optimize heat transfer. For example, the backside of a pedestal or other wafer support may be coated with a material that has a high emissivity to reduce or eliminate the need for coolant channels. Similarly, the top-side of the pedestal may be coated with a material that is an inefficient absorber of the IR radiation.

As discussed further below, the use of cold mirrors reduces the amount of IR radiation transmitted to the wafer and support. In some embodiments, the cold mirrors and/or the wafer support may be engineered such that the amount of the amount of IR transmitted to the wafer support is smaller than the heat loss from the support to the chamber walls, thereby eliminating the need for coolant channels. Coolant channels are particularly preferred for embodiments where the UV lamps are not equipped with cold mirrors.

The uniform heat source and sink, if necessary, should be closely coupled to the wafer to ensure that it controls the wafer temperature. The type of gas used, gas flow rate and pressure are important for providing an independent heat transfer mechanism to the wafer. A gas with high thermal conductivity (e.g., helium) is preferred to couple, for example, the pedestal or other support to the wafer. If the wafer is not in physical contact with the pedestal or other support, heat is still transferred between the support and the wafer. The support can then be used to control the temperature of the wafer.

Examples of preferred gases include inert gases such as helium, argon and nitrogen. In some embodiments, a reactive gas such as oxygen may be preferred. For example, a reactive gas may be preferred where post deposition surface modifications are desired. A reactive gas may also be preferred for applications where it accelerates the process, such as in porogen removal. Preferably, the gas does not absorb UV radiation.

Chamber pressure also affects wafer temperature. Chamber pressures are typically between 1 and 760 Torr. Operating at high pressure is preferred to effect good thermal coupling between the wafer and the pedestal. Higher pressure gas decreases the mean free path of the gas molecules and thus increases the conductivity. A preferred range is 10-600 Torr. An even more preferred range is 200-600 Torr. In some embodiments, it is desirable to operate at slightly below atmospheric pressure to permit the introduction of a reactive which may have elevated toxicity to human operators.

Gas flow rate is preferably between 1 and 100 standard liters per minute (slpm). An even more preferable range of gas flow rates is 1 to 10 slpm.

According to various embodiments, there is a gap between the wafer and the wafer support. As discussed above, a thermally conductive gas is used to transfer heat from the support to the wafer. The wafer may be held in place by an attachment such as a pin or floated on gas. Generally, the gap should be small to effect good thermal coupling between the support and the wafer.

In some embodiments, it is desirable to minimize contact between the wafer support and the wafer to minimize the particles on the backside of the wafer. For example, in some processes a photolithography step follows the curing of a low-k wafer. Because backside particles affect lithography, it is desirable to limit the backside particles. In preferred embodiments, the contacts or attachments between the wafer support and the wafer are minimized or eliminated, i.e. by minimizing the attachment points or by floating the wafers on gas, for example by the use of air bearings.

UV Light Sources

UV curing processes typically require high intensity light between 200 nm-400 nm. For most of the applications discussed above, including porogen removal, cross-linking, and curing nitrides, a preferred range for the light wavelength is 200 nm-260 nm. It is generally desirable to get as much intensity as possible in this range. Examples of suitable light sources include mercury lamps, pulsed xenon lamps, excimer lamps and excimer lasers.

Medium pressure mercury arc lamps are preferred. Mercury lamps emit a steady discharge with the typical emission lines of a mercury vapor spectrum including a fairly intense line at 254 nm. Mercury vapor lamps also exhibit significant radiant output in wavelengths down to 220 nm. As described earlier, the intensity of UV radiation may be increased by increasing the voltage applied to the metal electrodes of the lamp. Microwave-powered mercury lamps may also be used, and adjustment of UV output intensity may be achieved through modulation of the microwave energy that is coupled into the lamp bulb.

In preferred embodiments, the lamps are equipped with reflectors that reduce the amount of IR transmitted to the wafer. Cold mirrors are reflectors that transmit IR radiation and reflect UV radiation. For a parabolic cold mirror is located above the UV lamp, typically two-thirds of the UV radiation the wafer is exposed to is incident radiation reflected from the cold mirror, and one-third is direct radiation from the light source. Because the cold mirror does not reflect IR radiation, the amount of IR transmitted to the wafer is reduced by two-thirds. In some embodiments, the cold mirrors may be engineered so that the amount of IR transmitted to the wafer support is smaller than the heat loss from the support to the chamber walls, thereby eliminating the need for coolant channels. In other embodiments, the cold mirror and lamps may be arranged in such a manner that direct line of sight between lamps and the wafer is avoided, thus eliminating incidence on the wafer of all IR radiation, while using the cold mirror to reflect a substantial portion of the lamp's UV radiation output on to the wafer.

The one or more UV light sources in a single process station may be referred to as a lamp set. A lamp set may be a single UV lamp or multiple lamps. The number of UV lamps in a process station typically ranges from 1-20. A preferred range is 1-5. The number of stations typically ranges from 2-20, with a preferred range being from 4-6. In one embodiment using a focused lamp set, there is only one station having multiple lamps under which wafers are continuously scanned.

Commercially available lamps, usually tubular, are not optimized for illuminating the wafer uniformly. Exposure to a single light source may result in areas of localized exposure and thus non-uniform curing. In some embodiments, the relative orientation of a light set to the wafer may vary station to station so that any spots of non-uniformity are changed from station to station. In a preferred embodiment, the relative orientation is changed so that the total exposure from all of the light sources in the various stations is uniform over the wafer.

The lamps may either be flood lamps or focused lamps. Flood lamps typically have bulbs with parabolic reflectors that evenly distribute light over a larger area. Focused lamps utilize elliptical reflectors and deliver a high intensity band of light focused under the bulb. The wafer may be stationary during exposure to UV light from flood lamps as the area of illumination is large enough to cover the wafer. As the UV intensity is less than with focused lamps, temperature control is easier. Focused lamps require that the wafer be moved relative to the focal point of the reflector so that all locations on the wafer are brought under the area of influence of the lamp and reflector. Cold mirrors are particularly preferred for chambers with focused lamps to prevent a high intensity focused band of IR radiation from reaching the wafer.

In some applications, the desired properties of the film, such as strengthening or cross-linking, may be improved by periodic modulation of the UV intensity. In embodiments wherein flood lamps are used, the intensity of the radiation may modulated during the exposure period. In embodiments wherein focused illumination is used, the intensity may change from source to source or station to station.

In some embodiments, it may be desirable to vary the wavelength range of the emitted UV radiation from source to source or station to station. For example, one source may be tailored for porogen removal, and another for cross-linking. According to various embodiments, the type of source (i.e. mercury vapor lamp, pulsed xenon lamps) may be varied from source to source. Alternatively cold mirrors or filters may be used to tailor the spectrum of the emitted radiation of each source.

FIGS. 1a and 1b show one embodiment of an apparatus that uses flood lamps. As discussed above, FIG. 1a shows multiple cure stations 103, 105, 107 and 109 of chamber 101, each of which accommodates a wafer. Station 103 includes transfer pins 119.

FIG. 1b is a side view of the chamber showing stations 103 and 105 and wafers 113 and 115 located above pedestals 123 and 125. There are gaps 104 between the wafers and the pedestals. The wafer may be supported above the pedestal by an attachment, such as a pin, or floated on gas. Parabolic cold mirrors 153 and 155 are located above UV flood lamp sets 133 and 135. UV light from lamp sets 133 and 135 passes through windows 143 and 145. Wafers 103 and 105 are then exposed to the radiation. In alternative embodiments, the wafer may be supported by the pedestals 123 and 125. In such embodiments, the lamps may or may not be equipped with cold mirrors. By making full contact with the pedestal, the wafer temperature may be maintained by use of a conductive gas such as helium at a sufficiently high pressure, typically between 50 and 760 Torr, but preferably between 100 and 600 Torr.

Pedestals 123 and 125 are stationary. Indexer 111 lifts and moves each wafer from one pedestal to another between each exposure period. Indexer 111 is an indexer plate 121 attached to a motion mechanism 131 that has rotational and axial motion. Upward axial motion is imparted to indexer plate 121 to pick up wafers from each pedestal. The rotational motion serves to advance the wafers from one station to another. The motion mechanism then imparts downward axial motion to the plate to put the wafers down on the stations.

Pedestals 123 and 125 are electrically heated and maintained at a desired process temperature. Pedestals 123 and 125 may also be equipped with cooling lines, if needed. Each pedestal may have its own heating system. In an alternate embodiment, a large heater block may be used to support the wafers instead of individual pedestals. A thermally conductive gas, such as helium, is used to effect good thermal coupling between the pedestal and the wafer.

In operation each wafer is sequentially exposed to each UV light source. For example, wafer 113 is exposed to UV radiation from UV light source 133 for a set period of time. At the same time, wafer 115 is exposed to UV radiation from UV light source 135. Indexer 111 then advances wafer 113 to station 107 for exposure to radiation from wafer 115 to station 109 for exposure to the UV light sources associated with those stations. Wafers initially at stations 107 and 109 are similarly advanced to stations.

In this embodiment, station 103 is the transfer point for wafers. Transfer pins 119 elevate and a wafer that has been exposed to each of the UV light sources is transferred out. A new wafer is transferred to the pins and the pins lower. The wafer transfer may occur before or after each cycle.

In another embodiment that uses flood lamps, the wafer support is a carousel. Unlike with the stationary pedestal wafer supports, the wafers do not move relative to the carousel. After a wafer is loaded onto the carousel, the carousel rotates, if necessary, to expose the wafer to light from a UV lamp set. The carousel is stationary during the exposure period. After the exposure period, the carousel rotates to advance each wafer for exposure to the next set of lamps. Heating and cooling elements may be embedded within the rotating carousel. Alternatively the carousel may be in contact with a heater plate or hold the wafers so that they are suspended above a heater plate.

In the above embodiments, the UV lamps may be shut off or shielded to prevent exposure during wafer advancement and/or transfer.

Figure 2A:
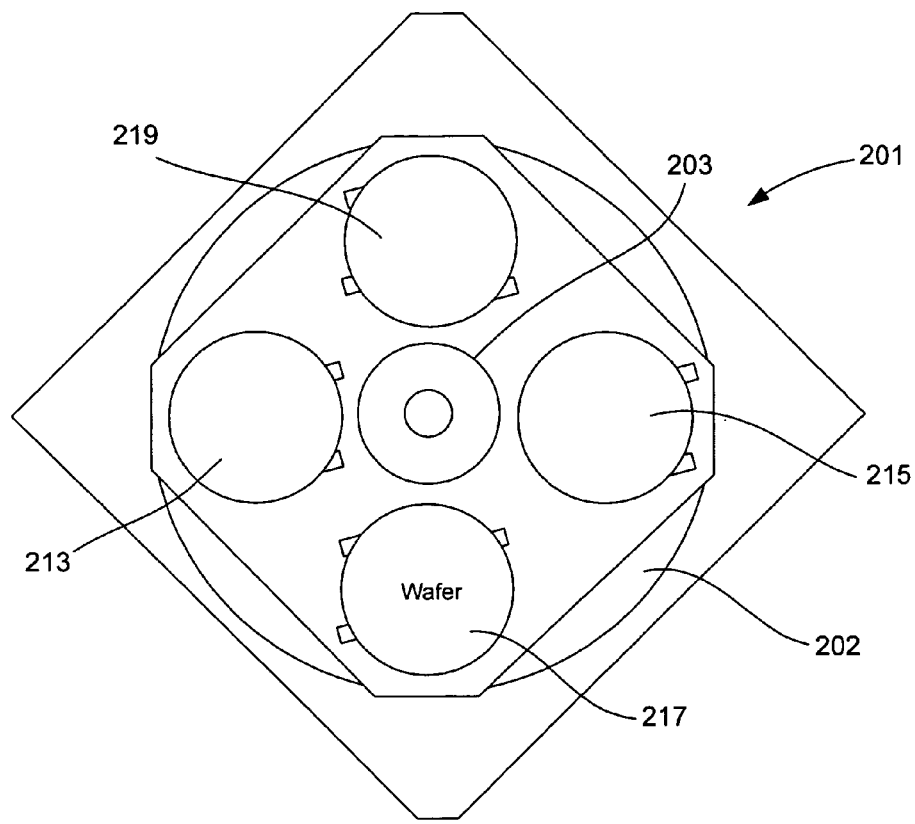
FIG. 2a is a schematic illustration showing a top view of a multi-station sequential cure chamber according to one embodiment of the present invention.
Figure 2B:
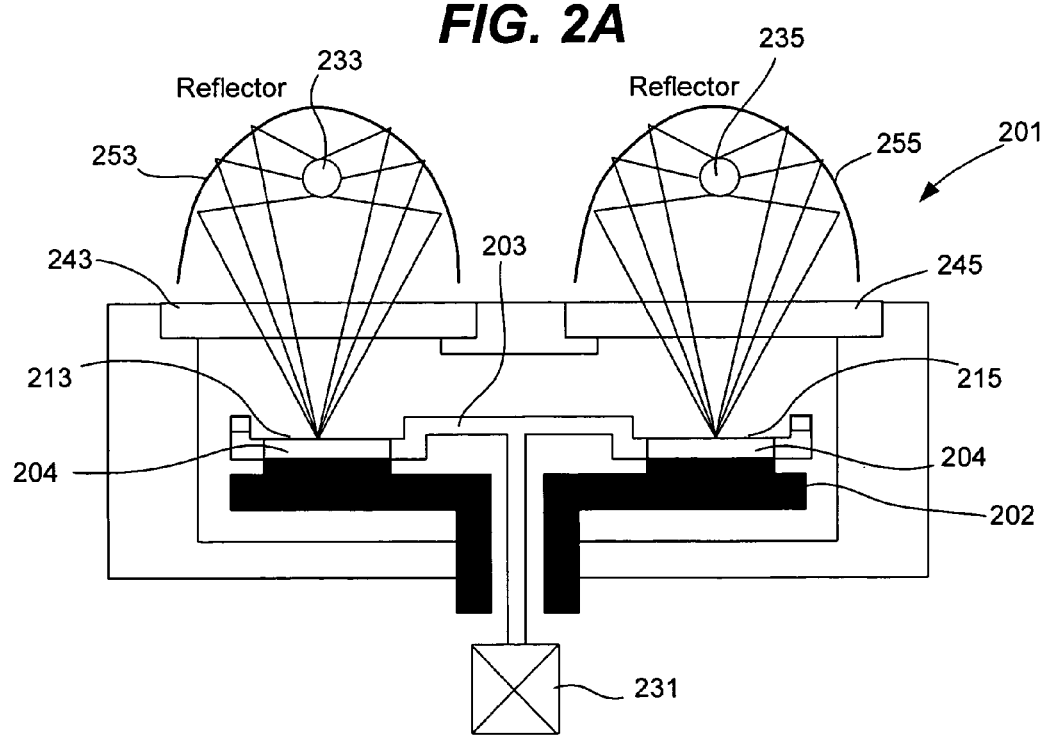

FIGS. 2a and 2b show an embodiment of the present invention that uses focused light sources. Unlike the flood lamp embodiments wherein the wafers are stationary during exposure, there is relative movement between the wafers and the light sources during exposure to the focused lights as the wafers are scanned. FIG. 2a is a top view of chamber 201. In this embodiment, the wafer support is carousel 203, which rotates wafers 213, 215, 217 and 219 above a stationary heater block 202. FIG. 2b shows a cross-section of chamber 201 showing wafers 213 and 215, carousel 203 and heater block 202. The wafer is suspended above heater block 202. There is a gap 204 between the wafers and the heater block. The gap between the wafer and the block may be engineered to be of any value, but preferably it is small and uniform to closely couple the wafer to the block. Heater block 202 may also contain coolant channels. Elliptical cold mirrors 253 and 255 are located above UV lamps 233 and 235. UV light from lamps 233 and 235 passes through windows 243 and 245.

Motion mechanism 231 imparts continuous rotational motion to carousel 203. The rotational motion serves to advance the wafers for scanning by sequential UV focused lamps. The carousel typically spins at a constant speed for uniform exposure to the lamps.

All wafers may be loaded onto the carousel before exposure. Alternatively a wafer may be placed on the carousel at a set point and removed when it returns to the point after exposure to all the lamps. In this embodiment, the carousel stops for wafer exchange. The wafer may exchange takes place at a point where the wafers are not being exposed to radiation. Alternatively the lamps may be shut off or shielded during the exchange.

A thermally conductive gas, such as helium, is used to effect good thermal coupling between the pedestal and the wafer. As discussed above, the use of cold mirrors is particularly preferred for focused light sources to ensure that the wafer temperature is decoupled from the UV intensity.

In another embodiment that utilizes focused lamps, the wafers are located above a rotating heater block. The wafers may be suspended above the block by pins, or floated on gas, for example using air bearings. Heating and cooling systems, if necessary, are embedded within the block.

Figure 3:
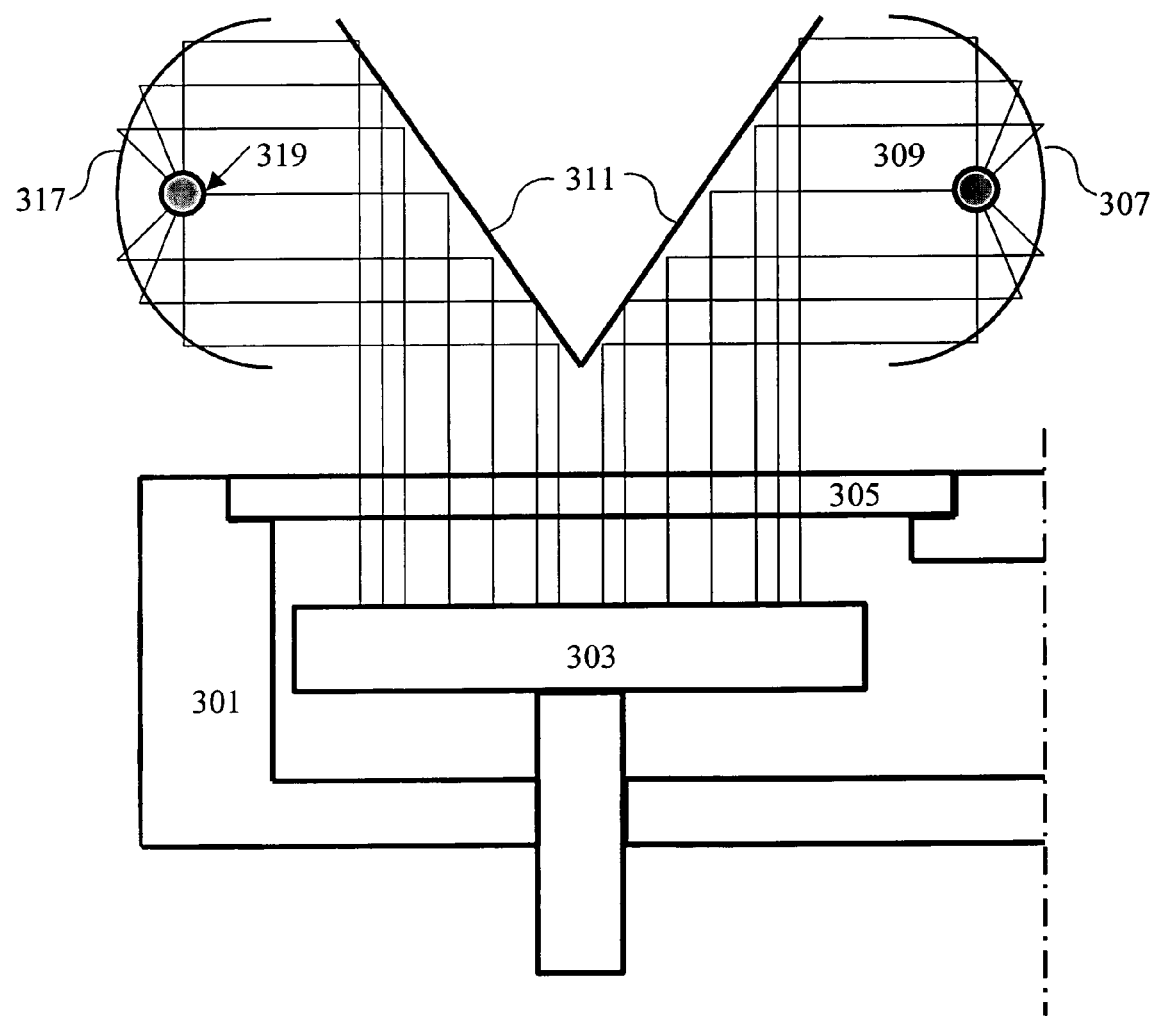
FIG. 3 is a schematic illustration showing a side view of a single station in the multi-station sequential cure chamber wherein a "cold mirror" reflector has been incorporated between the light source and the wafer.

FIG. 3 depicts the arrangement of a UV light source with a cold mirror reflector. In this embodiment, the cold mirror reflector seeks to diminish the incidence of IR radiation on the wafer, while permitting UV radiation to be available for processing. For clarity, this Figure depicts only one of the multiple processing stations available in the apparatus of this invention. Also, this Figure omits depiction of the wafer for purposes of clarity, and shows a flood-type reflector. It will be apparent to those skilled in this art that the principles depicted in FIG. 3 may also be applied to a focused reflector.

Referring to FIG. 3, pedestal 303 is embedded into one station of the multi-station processing chamber 301. Window 305 is located appropriately above pedestal 303 to permit radiation of the wafer (not shown here) with UV output of the desired wavelengths from UV lamps 309 and 319. Both lamps 309 and 319 are equipped with reflectors 307 and 317 which render their output into flood illumination. Reflectors 307 and 317 may themselves be made from "cold mirror" materials, i.e., they may also be designed to transmit IR and reflect UV radiation.

Radiation emanating directly from lamps 309 and 319 as well as that reflected from reflectors 307 and 317 is further incident upon a set of reflectors 311. These reflectors are also cold mirrors designed to reflect only those UV wavelengths that are desired for the purposes of curing the film on the wafer. All other radiation including visible and most particularly the IR is transmitted by this set of cold mirrors. Therefore the wafer is radiated only by those wavelengths that cause the desired effect on the film. It will be apparent to those skilled in this art that the specific angle, distance, and orientation of the cold mirror reflectors 311 with respect to the lamps 309 and 319 may be optimized to maximize the UV intensity incident on the wafer and to optimize the uniformity of its illumination.

Figure 4A:
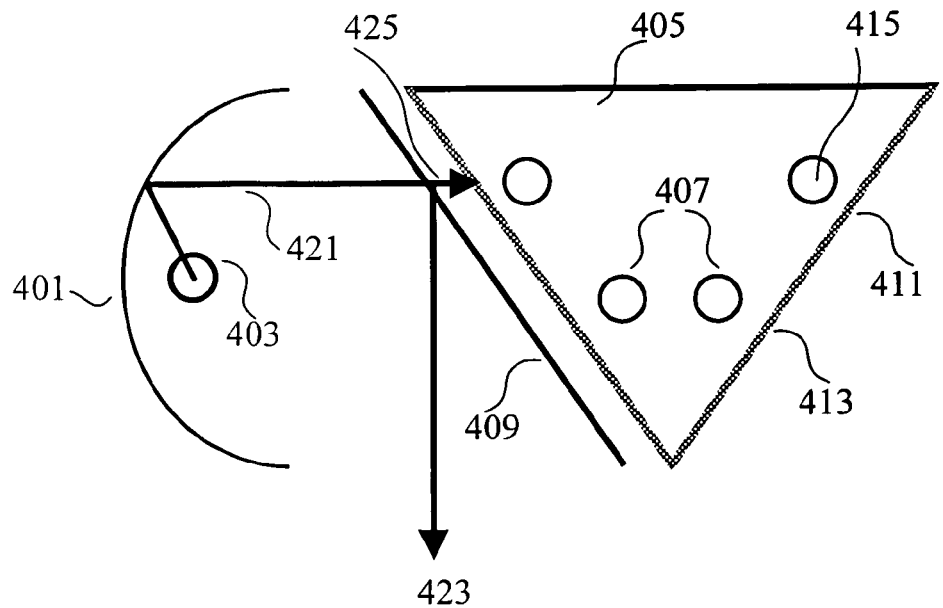
FIGS. 4a-c are a schematic illustrations of "cold mirror" reflectors and their energy-absorbing support mechanisms.

FIG. 4a depicts greater details of the cold-mirror apparatus. The cold mirror 409 is placed against a base 405. The surfaces of the base 405 against which the cold mirror 409 is mounted are coated with an IR-absorbing material 411 which is held in place by a heat-conducting epoxy or glue 413. Further, coolant channels 407 may be drilled or otherwise disposed into the base 405 to provide for an avenue by which heat may be removed from it. In this arrangement, composite light ray 421 emanating directly from the lamp 403 or reflected by the lamp reflector 401 is incident on the cold mirror 409. The cold mirror 409 then splits the composite beam 421 into the desirable UV component 423, which is reflected to the wafer. The undesirable component 425 is transmitted by the cold mirror 409 and is incident on the IR-absorbing material 411. The resulting heat is carried away from the material 411 through the heat-conducting epoxy 413 to the base 405. This heat is conducted through the base 405 to the cooling channels 407 wherein coolant 415 flow is provided to remove the heat and maintain a constant temperature.

In this embodiment, the base 405 must be made from a material that has superior thermal conductivity to effectively remove heat from the IR-absorbing material 411. Typically metals such as aluminum, copper, and nickel may be used to construct base 405. Alternatively, alloys such as brass and bronze may also be used. The IR-absorbing material 411 may consist of a thin sheet of material that has a very high absorptivity in the IR and visible wavelengths. Graphite and silicon carbide are preferred materials for this purpose. The coolant 415 may consist of any fluid with sufficiently high heat capacity, and water is the preferred medium. The cold mirror 409 consists of an engineered coating applied to a substrate. For the apparatus of FIG. 4 to perform its intended function, i.e., extract that portion of the lamp's output energy that is in the visible and IR spectrum, the substrate must be transparent to these wavelengths. Quartz is the preferred material for the substrate in cold mirror 409 because it fulfils this function.

Figure 4B:
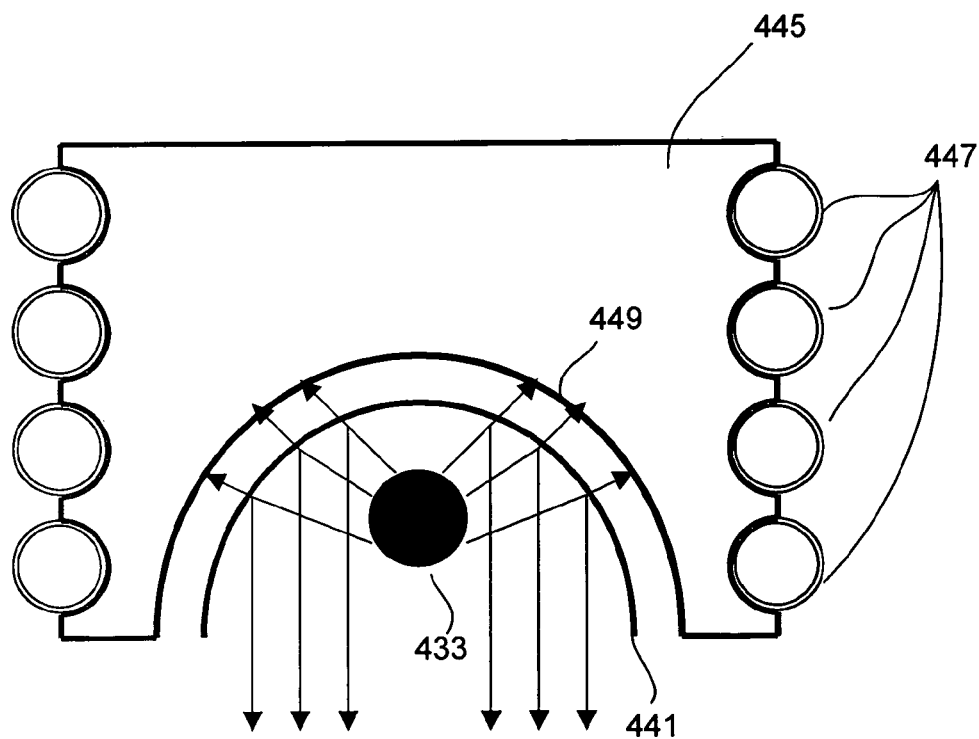
Figure 4C:
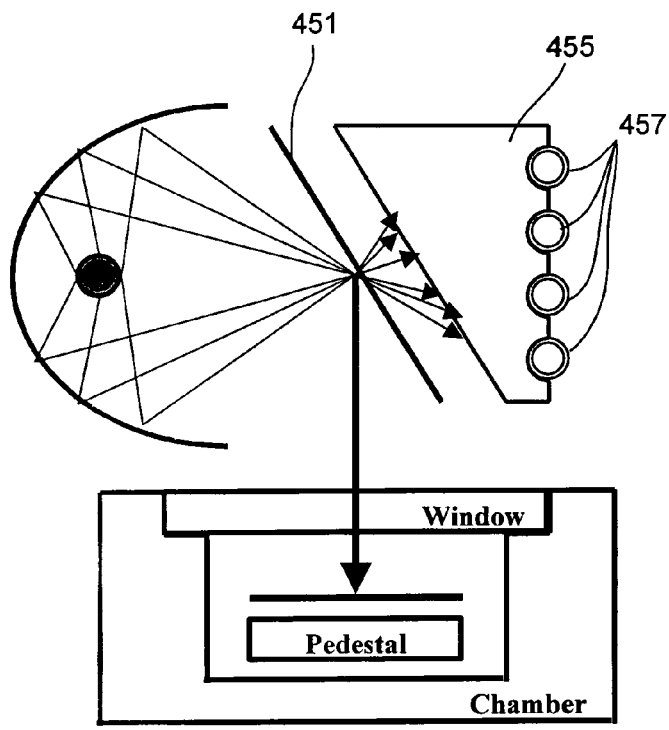

FIGS. 4b and 4c depict examples of arrangements of the cold mirror reflectors and the reflector block. Reflector block 445 in FIG. 4b includes cold mirror reflector 441 and coolant tubes 447. Radiation from light source 433 is reflected or transmitted as appropriate by cold mirror reflector 441. As in FIG. 4a, reflector block 445 is made a material that has superior thermal conductivity to remove heat from an IR-absorbent coating 449. FIG. 4c depicts a reflector block 455 that includes the second cold mirror reflector 451 (corresponding to reflectors 311 in FIG. 3) and cooling tubes 457.

Figure 5:
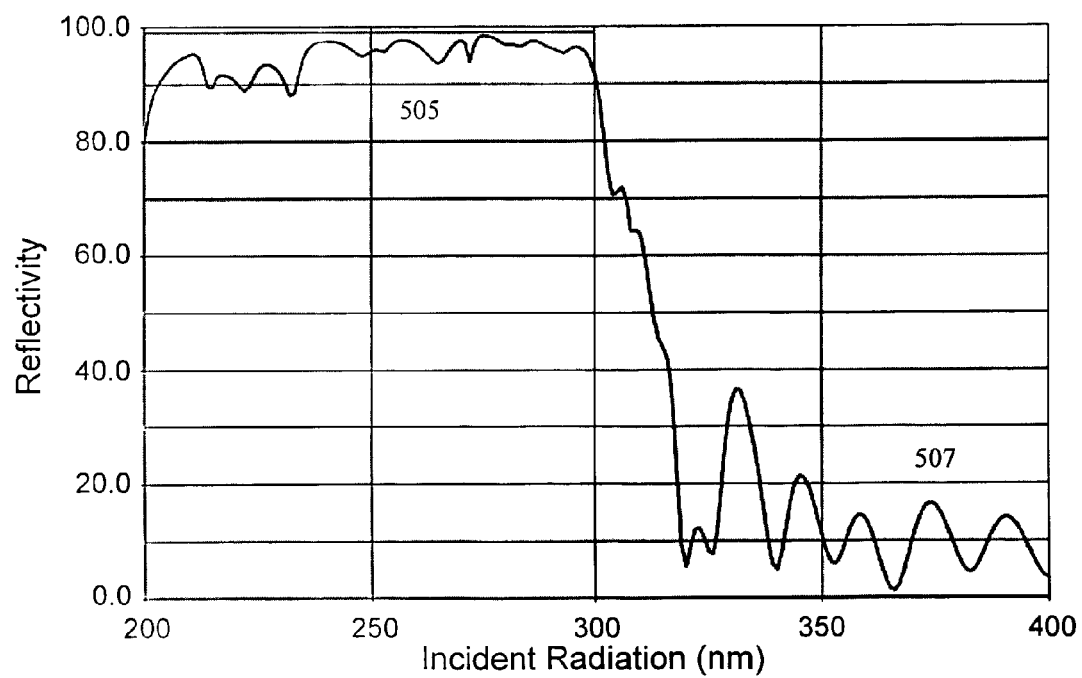
FIG. 5 depicts the reflectivity of a typical "cold mirror" coating applied to a glass substrate.

FIG. 5 is a graph that depicts the performance of a cold mirror coating as applied to a quartz substrate as per various embodiments of this invention. This graph plots reflectivity on the y-axis as a function of wavelength of the incident radiation on the x-axis. It is apparent that coatings can be designed to have a high degree of reflectivity (typically greater than 95% in the desired part of the UV spectrum (505) while transmitting undesirable wavelengths 507. The coating depicted in FIG. 5 is designed for maximum performance in the wavelength range between 200 and 300 nm, while transmitting all other wavelengths. It will be apparent to those skilled in this art that the coating may be designed to have maximum reflectivity at any range of wavelengths that corresponds to the desired effect on the wafer.

Although the foregoing invention has been described in some detail for purposes of clarity of understanding, it will be apparent that certain changes and modifications may be practiced within the scope of the appended claims. It should be noted that there are many alternative ways of implementing the present invention. Accordingly, the present embodiments are to be considered as illustrative and not restrictive, and the invention is not to be limited to the details given herein, but may be modified within the scope and equivalents of the appended claims.

What is claimed is:

1. An apparatus for curing a plurality of wafers, the apparatus comprising:
   a) a chamber housing;
   b) one or more wafer supports;
   c) a plurality of non-overlapping UV exposure areas;
   d) a plurality of UV light sources, each of which is associated with one and only one of the UV exposure areas, wherein each UV exposure area is illuminated by one and only one UV light source of the plurality of UV light sources; and e) a rotational mechanism configured to:
1) sequentially expose each wafer to each of the plurality of UV light sources, wherein each wafer is uniquely within the associated UV exposure area during exposure to a particular UV light source,
2) concurrently expose multiple wafers to light from separate UV light sources, and
3) concurrently transfer multiple wafers between sequential UV exposure areas, wherein each of the concurrently transferred wafers is transferred from a different UV exposure area than from which any of the other concurrently transferred wafers are transferred, and wherein each of the concurrently transferred wafers is transferred to a different UV exposure area than to which any of the other concurrently transferred wafers are transferred.

2. The apparatus of claim 1, further comprising a mechanism for controlling the temperature of the wafer independent of the UV light intensity.

3. The apparatus of claim 1, wherein each UV light source includes a reflector block, the reflector block comprising at least one reflector configured to direct light emitted from the light source towards the associated UV exposure area.

4. The apparatus of claim 1, wherein each light source includes a cold mirror.

5. The apparatus of claim 4, wherein each cold mirror is mounted on a base coated with an IR-absorbing material.

6. The apparatus of claim 5, wherein each base includes coolant tubes.

7. The apparatus of claim 1, wherein the one or more wafer supports are configured to control the temperature of wafers supported by the one or more wafer supports.

8. The apparatus of claim 1, wherein the one or more wafer supports comprises a plurality of pedestals.

9. An apparatus for curing a plurality of wafers, the apparatus comprising:
a) a chamber housing;
b) one or more wafer supports;
c) a plurality of non-overlapping UV exposure areas;
d) a plurality of UV flood lamp sets, each UV flood lamp set associated with one and only one of the UV exposure areas, wherein each UV exposure area is illuminated by one and only one of the UV flood lamp sets; and
e) a rotational mechanism configured to:
1) sequentially expose each wafer separately to each of the plurality of UV flood lamp sets, wherein each wafer is uniquely within the associated UV exposure area during exposure to a particular UV flood lamp set and is stationary with respect to the particular UV flood lamp set during exposure;
2) concurrently expose multiple wafers to light from separate UV flood lamp sets, and
3) concurrently transfer multiple wafers between sequential UV exposure areas, wherein each of the concurrently transferred wafers is transferred from a different UV exposure area than from which any of the other concurrently transferred wafers are transferred, and wherein each of the concurrently transferred wafers is transferred to a different UV exposure area than to which any of the other concurrently transferred wafers are transferred.

10. The apparatus of claim 9, wherein the one or more wafer supports comprises a plurality of stationary pedestals and wherein the rotational mechanism comprises an indexer configured to move the wafers between the stationary pedestals.

11. The apparatus of claim 9, wherein the one or more wafer supports comprises a single stationary heating block and wherein the rotational mechanism comprises an indexer.

12. The apparatus of claim 9, wherein the one or more wafer supports comprises a carousel and the rotational mechanism comprises a mechanism to rotate the carousel.

13. The apparatus of claim 9, further comprising a stationary heating block.

14. The apparatus of claim 9, wherein each UV flood lamp set includes a reflector block, the reflector block comprising at least one reflector configured to direct light emitted from the UV flood lamp set towards the associated UV exposure area.

15. The apparatus of claim 9, wherein each UV flood lamp set is equipped with a parabolic cold mirror.

16. The apparatus of claim 15, wherein each cold mirror is mounted on a base coated with an IR-absorbing material.

17. The apparatus of claim 16, wherein each base includes coolant tubes.

18. The apparatus of claim 9, wherein the relative orientation between a first wafer support and a UV flood lamp set located directly above the first wafer support is different from the relative orientation of a second wafer support and a UV flood lamp set located directly above the second wafer support, wherein the first and second wafer supports are different.

19. An apparatus for curing a plurality of wafers, the apparatus comprising:
a) a chamber housing;
b) one or more wafer supports;
c) a plurality of non-overlapping UV exposure areas;
d) a plurality of UV focused lamp sets, each of which is associated with one and only one of the UV exposure areas, wherein each UV exposure area is illuminated by one and only one UV focused lamp set of the plurality of UV focused lamp sets; and
e) a rotational mechanism configured to:
1) sequentially expose each wafer to each of the UV focused lamp sets, wherein each wafer is uniquely within the associated UV exposure area during exposure to a particular UV focused lamp set and there is continuous relative movement between each wafer and the particular UV focused lamp set during exposure;
2) concurrently expose multiple wafers to light from separate UV focused lamp sets, and
3) concurrently transfer multiple wafers between sequential UV exposure areas, wherein each of the concurrently transferred wafers is transferred from a different UV exposure area than from which any of the other concurrently transferred wafers are transferred, and wherein each of the concurrently transferred wafers is transferred to a different UV exposure area than to which any of the other concurrently transferred wafers are transferred.

20. The apparatus of claim 19, wherein the one or more wafer supports comprises a carousel and the rotational mechanism is further configured to rotate the carousel.

21. The apparatus of claim 19, wherein the one or more wafer supports comprises a stationary heating block and wherein the wafers are suspended above the heating block.

22. The apparatus of claim 19, further comprising a reflector block; wherein the reflector block comprises at least one reflector to reflect at least some of the light from a UV light source.

23. The apparatus of claim 19, wherein each UV lamp set is equipped with an elliptical cold mirror.

24. The apparatus of claim 23, wherein each cold mirror is mounted on a base coated with an IR-absorbing material.

25. The apparatus of claim 24, wherein each base includes coolant tubes.

26. The apparatus of claim 19, wherein the relative orientation between a first position and a lamp set located directly above the first position is different from the relative orientation of a second position and a lamp set located directly above the second position.

27. The apparatus of claim 1, wherein the rotational mechanism is centered among the plurality of UV exposure areas.

28. The apparatus of claim 1, wherein a relative orientation, as referenced to the rotational mechanism, between a first wafer support and a UV light source located directly above the first wafer support is different from a relative orientation, as referenced to the rotational mechanism, of a second wafer support and a UV light source located directly above the second wafer support, wherein the first and second wafer supports are different.

29. The apparatus of claim 1, further comprising a plurality of windows, each window associated with and disposed between a different UV light source and the associated UV exposure area, each window configured to prevent light emanated from the associated UV light source from illuminating the non-associated UV exposure areas.

30. The apparatus of claim 1, wherein each UV light source of the plurality of UV light sources includes a plurality of UV lamps.

31. The apparatus of claim 1, wherein:
the plurality of UV light sources includes a first UV light source with a first tubular lamp with a first illumination axis and a second UV light source with a second tubular lamp with a second illumination axis,
the plurality of UV exposure areas includes a first UV exposure area associated with the first UV light source and a second UV exposure area associated with the second UV light source,
the first illumination axis forms a first angle with respect to a first plane, the first plane coplanar with the rotational axis of the rotation mechanism and intersecting the center of the first UV exposure area,
the second illumination axis forms a second angle with respect to a second plane, the second plane coplanar with the rotational axis of the rotation mechanism and intersecting the center of the second UV exposure area, and
the first angle different from the second angle.

32. An apparatus for curing a plurality of wafers, the apparatus comprising:
a) a chamber housing;
b) one or more wafer supports;
c) a plurality of non-overlapping UV exposure areas;
d) a plurality of UV light sources, each of which is associated with one and only one of the UV exposure areas, wherein:
each UV exposure area is directly illuminated by the associated UV light source, and
each UV exposure area is not directly illuminated by any of the UV light sources associated with the other UV exposure areas; and
e) a rotational mechanism configured to:
1) sequentially expose each wafer to each of the plurality of UV light sources, wherein each wafer is uniquely within the associated UV exposure area during exposure to a particular UV light source,
2) concurrently expose multiple wafers to light from separate UV light sources, and
3) concurrently transfer multiple wafers between sequential UV exposure areas, wherein each of the concurrently transferred wafers is transferred from a different UV exposure area than from which any of the other concurrently transferred wafers are transferred, and wherein each of the concurrently transferred wafers is transferred to a different UV exposure area than to which any of the other concurrently transferred wafers are transferred.

* * * * *

UNITED STATES PATENT AND TRADEMARK OFFICE
CERTIFICATE OF CORRECTION

| | | |
|---|---|---|
| PATENT NO. | : 8,137,465 B1 | Page 1 of 1 |
| APPLICATION NO. | : 11/115576 | |
| DATED | : March 20, 2012 | |
| INVENTOR(S) | : Krishnan Shrinivasan et al. | |

It is certified that error appears in the above-identified patent and that said Letters Patent is hereby corrected as shown below:

On the application title page, the first inventor's name in field (75) "Krishna" should be changed to --Krishnan--.

Signed and Sealed this
Twenty-eighth Day of August, 2012

David J. Kappos
*Director of the United States Patent and Trademark Office*